United States Patent
Kuwabata et al.

(10) Patent No.: US 12,264,273 B2
(45) Date of Patent: *Apr. 1, 2025

(54) SEMICONDUCTOR NANOPARTICLES AND METHOD OF PRODUCING SEMICONDUCTOR NANOPARTICLES

(71) Applicants: OSAKA UNIVERSITY, Suita (JP); NATIONAL UNIVERSITY CORPORATION TOKAI NATIONAL HIGHER EDUCATION AND RESEARCH SYSTEM, Nagoya (JP); NICHIA CORPORATION, Anan (JP)

(72) Inventors: Susumu Kuwabata, Ibaraki (JP); Taro Uematsu, Suita (JP); Kazutaka Wajima, Toyonaka (JP); Tsukasa Torimoto, Nagoya (JP); Tatsuya Kameyama, Nagoya (JP); Daisuke Oyamatsu, Tokushima (JP); Kenta Niki, Tokushima (JP)

(73) Assignees: OSAKA UNIVERSITY, Suita (JP); NATIONAL UNIVERSITY CORPORATION TOKAI NATIONAL HIGHER EDUCATION AND RESEARCH SYSTEM, Nagoya (JP); NICHIA CORPORATION, Anan (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/464,517

(22) Filed: Sep. 11, 2023

(65) Prior Publication Data
US 2023/0416603 A1   Dec. 28, 2023

Related U.S. Application Data

(60) Division of application No. 17/449,255, filed on Sep. 28, 2021, now Pat. No. 11,788,003, which is a
(Continued)

(30) Foreign Application Priority Data

Mar. 18, 2016 (JP) .................................. 2016-055299
Sep. 12, 2016 (JP) .................................. 2016-177631
Feb. 28, 2017 (JP) .................................. 2017-037487

(51) Int. Cl.
C09K 11/62     (2006.01)
B01J 13/02     (2006.01)
(Continued)

(52) U.S. Cl.
CPC ............ C09K 11/621 (2013.01); B01J 13/02 (2013.01); C09B 67/0097 (2013.01);
(Continued)

(58) Field of Classification Search
None
See application file for complete search history.

(56) References Cited

U.S. PATENT DOCUMENTS

2005/0022628 A1 * 2/2005 Waki ..................... B82Y 30/00
2008/0252209 A1   10/2008 Jang et al.
(Continued)

FOREIGN PATENT DOCUMENTS

CN    104861964 A    8/2015
JP    2010106119 A   5/2010
(Continued)

OTHER PUBLICATIONS

Final Office Action, United States Patent and Trademark Office, issued to U.S. Appl. No. 16/732,877, filed Nov. 12, 2020, 10 pages.
(Continued)

*Primary Examiner* — Khaja Ahmad
(74) *Attorney, Agent, or Firm* — Hunton Andrews Kurth LLP

(57) ABSTRACT

A semiconductor nanoparticle includes a core and a shell covering a surface of the core. The shell has a larger bandgap energy than the core and is in heterojunction with the core. The semiconductor nanoparticle emits light when irradiated with light. The core is made of a semiconductor that contains $M^1$, $M^2$, and Z. $M^1$ is at least one element selected from the group consisting of Ag, Cu, and Au. $M^2$ is at least one element selected from the group consisting of Al, Ga, In and Tl. Z is at least one element selected from the group consisting of S, Se, and Te. The shell is made of a semi-
(Continued)

conductor that consists essentially of a Group 13 element and a Group 16 element.

5 Claims, 19 Drawing Sheets

Related U.S. Application Data continuation of application No. 16/732,877, filed on Jan. 2, 2020, now Pat. No. 11,162,024, which is a division of application No. 15/459,767, filed on Mar. 15, 2017, now Pat. No. 10,563,122.

(51) Int. Cl.
| | | |
|---|---|---|
| *B82Y 30/00* | (2011.01) | |
| *B82Y 40/00* | (2011.01) | |
| *C09B 67/02* | (2006.01) | |
| *C09K 11/02* | (2006.01) | |
| *G02F 1/1335* | (2006.01) | |
| *G02F 1/13357* | (2006.01) | |
| *H01L 33/50* | (2010.01) | |

(52) U.S. Cl.
CPC .............. *C09K 11/02* (2013.01); *B82Y 30/00* (2013.01); *B82Y 40/00* (2013.01); *G02F 1/133614* (2021.01); *G02F 1/133617* (2013.01); *H01L 33/502* (2013.01); *Y10S 977/774* (2013.01); *Y10S 977/813* (2013.01); *Y10S 977/892* (2013.01); *Y10S 977/896* (2013.01); *Y10S 977/95* (2013.01)

(56) References Cited

U.S. PATENT DOCUMENTS

| | | | |
|---|---|---|---|
| 2008/0277625 A1 | 11/2008 | Nakamura et al. | |
| 2009/0020710 A1 | 1/2009 | Yu et al. | |
| 2009/0139574 A1* | 6/2009 | Pickett | H01B 1/02 977/773 |
| 2010/0159248 A1 | 6/2010 | Jang et al. | |
| 2010/0193806 A1 | 8/2010 | Byun | |
| 2010/0283072 A1 | 11/2010 | Kazlas et al. | |
| 2011/0025224 A1 | 2/2011 | Wood et al. | |
| 2011/0031452 A1* | 2/2011 | Krauss | C09K 11/883 977/773 |
| 2011/0315954 A1 | 12/2011 | Jang et al. | |
| 2012/0060928 A1 | 3/2012 | Johnson et al. | |
| 2012/0193605 A1* | 8/2012 | Gillies | B82Y 30/00 257/14 |
| 2012/0292594 A1* | 11/2012 | Zhou | C09K 11/883 977/773 |
| 2014/0144500 A1 | 5/2014 | Cao et al. | |
| 2014/0170692 A1* | 6/2014 | Krauss | C09K 11/565 435/29 |
| 2014/0264257 A1* | 9/2014 | Hughes | C09K 11/02 438/47 |
| 2015/0076469 A1 | 3/2015 | Ikemizu et al. | |
| 2015/0162468 A1* | 6/2015 | Newman | H01L 31/0749 136/265 |
| 2015/0315460 A1* | 11/2015 | Gim | H10K 85/6572 977/774 |
| 2016/0200939 A1 | 7/2016 | Cho et al. | |
| 2016/0268483 A1* | 9/2016 | Theobald | H01L 33/502 |
| 2016/0333267 A1 | 11/2016 | Chen et al. | |
| 2016/0357039 A1 | 12/2016 | Kim et al. | |
| 2022/0017819 A1 | 1/2022 | Kuwabata et al. | |

FOREIGN PATENT DOCUMENTS

| | | |
|---|---|---|
| JP | 2010177656 A | 8/2010 |
| JP | 2012212862 A | 11/2012 |
| JP | 2012527402 A | 11/2012 |
| JP | 2013544938 A | 12/2013 |
| JP | 2014502052 A | 1/2014 |
| WO | 2006009124 A1 | 1/2006 |
| WO | 2008120626 A1 | 10/2008 |
| WO | 2012075267 A1 | 6/2012 |
| WO | 2014129067 A1 | 8/2014 |
| WO | 2015082940 A1 | 6/2015 |
| WO | 2016179920 A1 | 11/2016 |

OTHER PUBLICATIONS

Jara, Stamplecoskie and Kamat, Two Distinct Transitions in CuxInS2 Quantum Dots. Bandgap versus Sub-Bandgap Excitations in Copper-Deficient Structures, J. Phys. Chem. Lett. 2016, 7: 1452-1459.
Miyake, H., et al., Solution growth of chalcopyrite type semiconductor crystals, Department of Electrical and Electronic Engineering, Faculty of Engineering, Mie University, pp. 173-177, 8 pages, 2019.
Non-Final Office Action, United States Patent and Trademark Office, issued to U.S. Appl. No. 16/732,877, filed Jul. 22, 2020, 9 pages.
Non-Final Office Action, United States Patent and Trademark Office, issued to U.S. Appl. No. 17/449,255, filed Dec. 16, 2022, 14 pages.
Notice of Allowance, United States Patent and Trademark Office, issued to U.S. Appl. No. 16/732,877, filed Jun. 29, 2021, 10 pages.
Notice of Allowance, United States Patent and Trademark Office, issued to U.S. Appl. No. 17/449,255, filed Jun. 12, 2023, 9 pages.
Requirement for Restriction, United States Patent and Trademark Office, issued to U.S. Appl. No. 17/449,255, filed Sep. 12, 2022, 7 pages.
Torimoto et al., "Remarkable photoluminescence enhancement of ZnS-AgInS2 solid solution nanoparticles by post-synthesis treatment." Chem Commun., 2010, vol. 46, pp. 2082-2084.

* cited by examiner

SEMICONDUCTOR NANOPARTICLES AND METHOD OF PRODUCING SEMICONDUCTOR NANOPARTICLES

CROSS REFERENCE TO RELATED APPLICATIONS

This a divisional application of U.S. patent application Ser. No. 17/449,255, filed Sep. 28, 2021, which is a continuation application of U.S. patent application Ser. No. 16/732,877, filed Jan. 2, 2020, which is a divisional application of U.S. patent application Ser. No. 15/459,767, filed Mar. 15, 2017, which claims the benefit of Japanese Patent Application Nos. 2016-055299, 2016-177631, and 2017-037487, filed on Mar. 18, 2016, Sep. 12, 2016, and Feb. 28, 2017, respectively. The entire disclosures of all are hereby incorporated by reference.

BACKGROUND

Technical Field

The present disclosure relates to semiconductor nanoparticles, a method of producing the semiconductor nanoparticles, and a light-emitting device using the semiconductor nanoparticles.

Description of Related Art

White light-emitting devices, which are used as backlights of a liquid crystal display devices and the like and which utilize photoluminescence emission from quantum dots (also called "semiconductor quantum dots"), have been proposed. Fine particles of semiconductor with a particle size of 10 nm or less, for example, are known to exhibit a quantum size effect. Such nanoparticles are called the quantum dots. The quantum size effect is a phenomenon where a valence band and a conduction band, each of which is regarded as continuous in bulk particles, become discrete when the particle size is on the nanoscale, whereby a bandgap energy is varied in accordance with their particle size.

Quantum dots absorb light and emit light corresponding to the bandgap energy thereof. Thus, quantum dots can be employed as a wavelength conversion material in light-emitting devices. Light-emitting devices using quantum dots are proposed, for example, in Japanese Unexamined Patent Application Publication No. 2012-212862 and Japanese Unexamined Patent Application Publication No. 2010-177656. More specifically, a portion of the light emitted from a light-emitting diode (LED) chip is absorbed by quantum dots, and photoluminescence of another color is emitted from the quantum dots. The photoluminescence emitted from the quantum dots and the light from the LED chip not absorbed by the quantum dots are mixed to produce white light. In these patent application documents, use of quantum dots made of a Group 12-Group 16 material, such as CdSe or CdTe, or a Group 14-Group 16 material, such as PbS or PbSe, is proposed. In International Patent Application Publication No. WO 2014/129067 A, a wavelength conversion film in which core-shell semiconductor quantum dots that does not contain Cd or Pb in view of toxicity of these elements is proposed. The formation of such a core-shell structure is also described in Chemical, Communications. 2010, vol. 46, pp 2082-2084.

One of the advantages of using quantum dots in light-emitting devices is that light with a wavelength corresponding to a bandgap of the quantum dots can have a peak with a relatively narrow full width at half maximum. Of the quantum dots proposed as the wavelength conversion material, quantum dots made of a binary semiconductor, typified by Group 12-14 semiconductors, such as CdSe, is confirmed to emit the light with the wavelength corresponding to the bandgap of the quantum dots, i.e., band-edge emission. Meanwhile, ternary quantum dots, in particular, Group 11-13-16 quantum dots have not been confirmed to exhibit the band-edge emission. The light emission from the Group 11-13-16 quantum dots is caused by the defect levels at the surface or inside of the particles, or by the donor-acceptor-pair recombination, so that such light has a broad photoluminescence peak with a wide full width at half maximum and a long photoluminescence lifetime. Such light emission is not suitable for light-emitting devices, particularly, used in liquid crystal display device. This is because a light-emitting device used in a liquid crystal display device is required to emit light with a narrow full width at half maximum that has a peak wavelength corresponding to each of three primary colors (i.e., RGB) in order to ensure high color reproducibility. For this reason, practical application of the ternary quantum dots has not been prompted despite its less toxic composition.

SUMMARY

Therefore, one object of certain embodiments of the present disclosure is to provide semiconductor nanoparticles that are configured to produce band-edge emission from ternary or quaternary quantum dots with a less toxic composition, and a method of producing the semiconductor nanoparticles.

According to certain embodiments of the disclosure, a semiconductor nanoparticle includes a core and a shell covering a surface of the core. The shell has a bandgap energy larger than a bandgap energy of the core and is in heterojunction with the core. The semiconductor nanoparticle is adapted to emit light upon being irradiated with light. The core is made of a semiconductor that contains $M^1$, $M^2$, and Z. $M^1$ is at least one element selected from the group consisting of Ag, Cu, and Au. M 2 is at least one element selected from the group consisting of Al, Ga, In, and Tl. Z is at least one element selected from the group consisting of S, Se, and Te. The shell is a semiconductor that consists essentially of a Group 13 element and a Group 16 element.

Furthermore, according to other certain embodiments of the disclosure, a method of producing semiconductor nanoparticles includes:
  providing a dispersion in which primary semiconductor nanoparticles are dispersed into a solvent, each of the primary semiconductor nanoparticles being made of a semiconductor that contains $M^1$, $M^2$, and Z, where $M^1$ is at least one element selected from the group consisting of Ag, Cu, and Au, M 2 is at least one element selected from the group consisting of Al, Ga, In, and Tl, and Z is at least one element selected from the group consisting of S, Se, and Te; and
  adding, to the dispersion, a compound containing a Group 13 element and an elemental substance of a Group 16 element or a compound containing a Group 16 element, to form a semiconductor layer consisting essentially of the Group 13 element and the Group 16 element on the surface of each of the primary semiconductor nanoparticles.

In the semiconductor nanoparticles according to certain embodiments of the present disclosure, the surface of the core made of a ternary semiconductor is covered with the shell made of the semiconductor containing the Group 13 element and the Group 16 element, the shell having a bandgap energy larger than that of the semiconductor forming the core. With this arrangement, photoluminescence emission with a short photoluminescence lifetime, i.e., the band-edge emission, which cannot be obtained by conventional ternary quantum dots, is obtained. In the semiconductor nanoparticles, each of the core and shell can have composition that contains neither Cd nor Pb, which are highly toxic. Thus, the semiconductor nanoparticles can be applied to products that are prohibited from using Cd or the like. Therefore, such semiconductor nanoparticles are suitable for use as a wavelength conversion material for light-emitting devices used in the liquid crystal display device or the like or as a biomolecule marker. Furthermore, with the method of producing semiconductor nanoparticles as described above, the ternary semiconductor nanoparticles that exhibit band-edge emission can be relatively easily produced.

DETAILED DESCRIPTION

Figure 1:
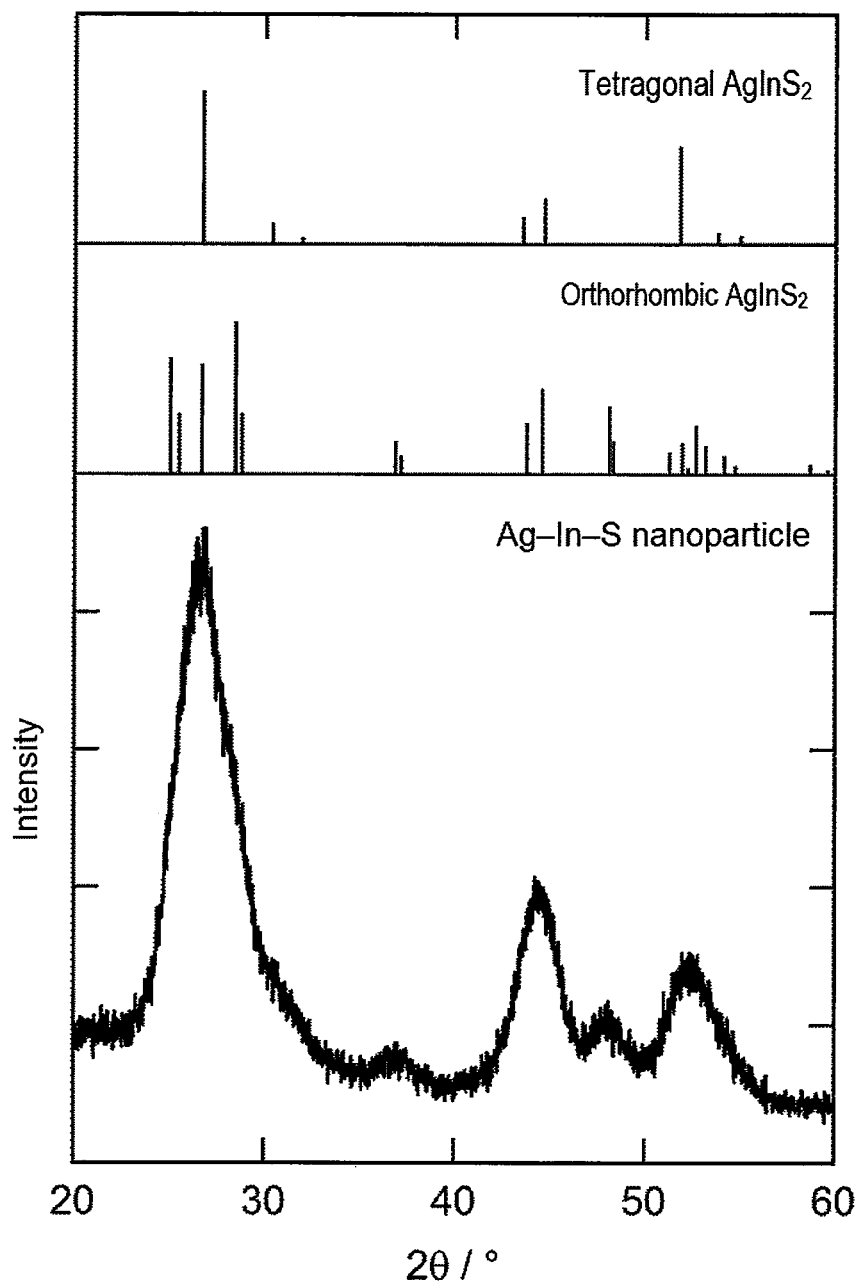
FIG. 1 shows an X-ray diffraction (XRD) pattern of primary semiconductor nanoparticles (cores) produced in Example 1.

Certain embodiments of the present disclosure will be described in detail below. Note that the present disclosure is not intended to be limited by the following embodiments. Description in one embodiment and its variant example can be applied to other embodiments and variant examples unless otherwise specified.

Outline of Embodiments

Because ternary quantum dots produced in the common production method have not yet been confirmed to exhibit the band-edge emission, the inventors have studied the configuration of ternary quantum dots, in particular, Group 11-13-16 quantum dots, from which band-edge emission can be obtained. During these studies, the inventors have considered the possibility of producing the band-edge emission by modifying the state of the surface of ternary or quaternary quantum dots. In particular, the inventors have examined the modification of the surface state of the quantum dot by covering the surface of each of the quantum dots with an appropriate semiconductor. Consequently, the inventors have found that band-edge emission can be obtained from ternary or quaternary quantum dots each covered by a semiconductor that consists essentially of a Group 13 element and a Group 16 element, achieving the embodiments described herein. CdSe, from which the band-edge emission is confirmed, having the surface covered by CdS or the like for further enhancement of its band-edge emission has already proposed. Also, ternary quantum dots each having the surface covered by ZnS, ZnSe, or the like has already proposed. However, it has not been reported that employing ternary or quaternary quantum dots, from which band-edge emission is not or barely observed in a photoluminescence spectrum, as a core and covering the surface of the core with a shell made of a specific semiconductor allows for obtaining band-edge emission.

Semiconductor nanoparticles in the present embodiment each includes a core and a shell covering the surface of the core. The core is made of a semiconductor that contains $M^1$, $M^2$, and Z, in which $M^1$ is at least one element selected from the group consisting of Ag, Cu, and Au, $M^2$ is at least one element selected from the group consisting of Al, Ga, In and Tl, and Z is at least one element selected from the group consisting of S, Se, and Te. The shell is made of a semiconductor that consists essentially of a Group 13 element and a Group 16 element and has a larger bandgap energy than the bandgap energy of the core. The shell is in heterojunction with the core. In the description below, the core, which is ternary or quaternary, and the shell will be illustrated.

Core

Ternary Core

The core made of a ternary semiconductor is made of semiconductor containing $M^1$, $M^2$, and Z, and has a shape of a particle. Thus, the core is a semiconductor nanoparticle. $M^1$ is at least one element selected from the group consisting of Ag, Cu, and Au, preferably Ag or Cu, and particularly preferably Ag. When $M^1$ is Ag, the core (corresponding to a primary semiconductor nanoparticle used in a method of producing semiconductor nanoparticles to be described below) can be easily synthesized. Two or more elements may be contained as $M^1$. The crystal structure of the core may be at least one selected from the group consisting of a tetragonal system, a hexagonal system, and an orthorhombic system.

$M^2$ is at least one element selected from the group consisting of Al, Ga, In, and Tl, preferably In or Ga, and particularly preferably In. With In, a by-product is not easily generated, and thus In is preferable. $M^2$ may contain two or more elements.

Z is at least one element selected from the group consisting of S, Se, and Te, and preferably S. The core in which Z is S has a bandgap wider than that of a core containing Se or Te as the element Z. Accordingly, the core containing S allows for easily emitting photoluminescence of a visible light region, and thus is preferable. Z may contain two or more elements.

The combinations of $M^1$, $M^2$, and Z may be appropriately selected. Examples of the combination of $M^1$, $M^2$, and Z (typical notation is: $M^1/M^2/Z$) preferably include Cu/In/S, Ag/In/S, Ag/In/Se, and Ag/Ga/S.

A semiconductor containing the above specific elements and having the crystal structure of the tetragonal system, hexagonal system, or orthorhombic system is generally represented by a composition formula of $M^1M^2Z_2$, as indicated in various literature and the like. Of the semiconductors represented by the composition formula of $M^1M^2Z_2$, a semiconductor having the hexagonal system is of the wurtzite type, and a semiconductor having the tetragonal system is of the chalcopyrite type. The crystal structure is identified, for example, by measuring a X-ray diffraction (XRD) pattern obtained by X-ray diffraction. More specifically, an XRD pattern obtained from the core is compared with a known XRD pattern of semiconductor nanoparticles represented by the composition formula of $M^1M^2Z_2$, or an XRD pattern determined by simulation from crystal structure parameters. If one of the known patterns or simulated patterns is identical to the pattern of the core, the semiconductor nanoparticle of such a core can be regarded to have the same crystal structure as that of the identical known or simulated pattern. The aggregate of the semiconductor nanoparticles may contain a plurality of kinds of nanoparticles with different crystal structures of the cores. In that case, the XRD pattern having peaks derived from a plurality of crystal structures is observed.

The core made of a ternary semiconductor does not have a stoichiometric composition represented by the general formula above in practice, and in particular, the ratio of the number of atoms of $M^1$ to that of $M^2$ (i.e., $M^1/M^2$) is smaller than 1. The sum of the number of atoms of $M^1$ and the number of atoms of $M^2$ may not be equal to the number of atoms of Z. In the semiconductor nanoparticles of this embodiment, the core made of the ternary semiconductor may be made of a semiconductor with such a non-stoichiometric composition. In the present specification, when it does not matter whether semiconductors containing specific elements has a stoichiometric composition or not, the semiconductor composition is represented by a formula in which constituent elements are connected by a "—" mark, such as $M^1$—$M^2$—Z.

The core may be substantially made of only $M^1$, $M^2$, and Z. Note that the term "substantially" as used herein is used in view of possible presence of one or greater elements other than the elements $M^1$, $M^2$, and Z that may be unintentionally mixed in as impurities or the like.

Alternatively, the core may contain other elements. For example, a part of $M^2$ may be substituted with other metal elements. Such other metal elements may be those which form +trivalent metal ions, specifically, one or more elements selected from Cr, Fe, Al, Y, Sc, La, V, Mn, Co, Ni, Ga, In, Rh, Ru, Mo, Nb, W, Bi, As, and Sb. The substitution amount of the substitution element is preferably 10% or less when the total number of atoms of $M^2$ and the substitution element is set to 100%.

Quaternary Core

The core made of a quaternary semiconductor is made of a semiconductor containing $M^1$, $M^2$, $M^3$, and Z, and is a semiconductor nanoparticle, similar to the core made of a ternary semiconductor. The crystal structure of the core formed of quaternary semiconductor may be at least one selected from the group consisting of a tetragonal system, a hexagonal system, and an orthorhombic system. The aggregate of the nanoparticles may contain a plurality of nanoparticles with different crystal structures of the cores. In that case, the XRD pattern having peaks derived from a plurality of crystal structures is observed. $M^1$, $M^2$, and Z have been described above in relation to the ternary core, and thus their description will be omitted. $M^3$ is at least one element selected from the group consisting of Zn and Cd. $M^3$ is preferably Zn. When $M^3$ is Zn, the semiconductor nanoparticles in the present embodiment with a less toxic composition can be provided. Also, when Cd is employed, the amount of Cd in such a core can be reduced compared to the binary core using Cd. Thus, the semiconductor nanoparticles of this embodiment with a less toxic composition can be provided.

The combinations of $M^1$, $M^2$, $M^3$, and Z (typical notation is: $M^1/M^2/M^3/Z$) can be appropriately selected. Preferable examples of the combination of $M^1/M^2/M^3/Z$ include Cu/In/Zn/S, and Ag/In/Zn/S.

The semiconductor containing the above specific four kinds of elements and having the crystal structure of the tetragonal system, hexagonal system, or orthorhombic system is generally represented by a composition formula of $(M^1M^2)_xM^3_yZ_2$ (where x+y=2), as indicated in various literature and the like. That is, the semiconductor represented by this composition formula can be regarded as a semiconductor represented by the composition formula of $M^1M^2Z_2$ described in relation to the core made of the ternary semiconductor in which $M^3$ is doped or in which $M^1M^2Z_2$ and $M^3Z$ form a solid solution.

The core made of the quaternary semiconductor may actually not have a stoichiometric composition represented by the general formula above in practice, and particularly, the ratio of the number of atoms $M^1$ to that of $M^2$ (i.e., $M^1/M^2$) is smaller than 1. Furthermore, the sum of x and y, namely, x+y may not be 2. In the semiconductor nanoparticles of the present embodiment, the core formed of the quaternary semiconductor may be made of a semiconductor with such a non-stoichiometric composition. In the present specification, when it does not matter whether the quaternary semiconductor has the stoichiometric composition or not, in the present specification, the semiconductor composition may be represented by a formula in which constituent elements are connected by a "—" mark, such as $M^1$—$M^2$—$M^3$—Z. A method of identifying the crystal structure of the quaternary semiconductor is the same as that explained in relation to the core made of a ternary semiconductor. The core made of the quaternary semiconductor may be substantially made of only $M^1$, $M^2$, $M^3$, and Z. Note that the term "substantially" as used herein is used in view of possible presence of one or greater elements other than the elements $M^1$, $M^2$, $M^3$, and Z that may be unintentionally mixed in as impurities or the like. Alternatively, the core made of a quaternary semiconductor may contain other elements.

For example, a part of $M^2$ may be substituted with other metal elements. Examples of such other metal elements and the substitution amount or rate thereof have been described above in relation to the ternary core, and thus their description will be omitted.

Additionally or alternatively, a part of $M^3$ may be substituted with other metal elements. Such other metal elements may be those which form +divalent metal ions. More specifically, such other elements may be at least one element selected from Co, Ni, Pd, Sr, Ba, Fe, Cr, Mn, Cu, Cd, Rh, W, Ru, Pb, Sn, Mg, and Ca. The substitution amount is preferably 10% or less when the total number of atoms of $M^3$ and the substitution element is set to 100%.

Shell

In this embodiment, the shell is formed of a semiconductor that has a bandgap energy larger than a bandgap energy of the semiconductor forming the core and that consists essentially of a Group 13 element and a Group 16 element. Examples of the Group 13 element can include B, Al, Ga, In, and Tl, and examples of the Group 16 element can include O, S, Se, Te, and Po. The semiconductor constituting the shell may contain one kind of the Group 13 element, or two or more kinds of the Group 13 elements, and may contain one kind of the Group 16 element, or two or more kinds of the Group 16 elements. Specifically, the expression "essentially" refers to that the ratio of elements other than the Group 13 element and the Group 16 element is 5% or less when the total number of atoms of all the elements contained in the shell is set to 100%.

The semiconductor forming the core has a bandgap energy as below. The Group 11-13-16 ternary semiconductor or the quaternary semiconductor based on this ternary semiconductor generally has a bandgap energy of 1.0 eV to 3.5 eV. In particular, a semiconductor made of Ag—In—S has a bandgap energy of 1.8 eV to 1.9 eV. Furthermore, a semiconductor made of Ag—In—Zn—S has a bandgap energy of 1.8 eV to 3.9 eV. Composition of the shell may be selected in accordance with the bandgap energy of the semiconductor forming the core. Alternatively, in the case where the composition or the like of the shell is determined, the core may be designed such that the bandgap energy of the semiconductor forming the core is smaller than that of the shell.

More specifically, the shell may have a bandgap energy, for example, of 2.0 eV to 5.0 eV, and in particular, 2.5 eV to 5.0 eV. The bandgap energy of the shell may be greater than that of the core, for example, by about 0.1 eV to about 3.0 eV, particularly about 0.3 eV to about 3.0 eV, and more particularly about 0.5 eV to about 1.0 eV. With a small difference in bandgap energy between the shell and the core, the ratio of photoluminescence emission other than the band-edge emission with respect to photoluminescence from the core may be increased, leading to a reduction in the ratio of the band-edge emission.

Furthermore, the bandgap energies of the core and the shell are preferably selected in such a manner as to form a type-I band alignment, in which the bandgap energy of the core is between the bandgap energy of the shell in the heterojunction between the core and the shell. With the type-I band alignment, the band-edge emission from the core can be more effectively obtained. In the type-I band alignment, between the bandgap of the core and the bandgap of the shell, a barrier of preferably at least 0.1 eV, particularly 0.2 eV or higher, and more particularly 0.3 eV or higher may be generated. The upper limit of the barrier is, for example, 1.8 eV, particularly, 1.1 eV. If the barrier is small, the ratio of photoluminescence other than the band-edge emission with respect to the photoluminescence emission from the core may be increased, which may lead to a reduction in the ratio of the band-edge emission.

In the present embodiment, the shell may contain In or Ga as the Group 13 element. In this embodiment, the shell may contain S as the Group 16 element. A semiconductor containing In or Ga, or containing S tends to have a bandgap energy larger than that of the Group 11-13-16 ternary semiconductor.

The semiconductor forming the shell may have a crystal system that matches the crystal system of the core semiconductor, and may have lattice constant identical to or close to that of semiconductor forming the core. The shell made of the semiconductor having the crystal system that matches that of the core and having the lattice constant close to that of the core may efficiently cover the periphery of the core. Here, the shell in which a multiple of the lattice constant of the shell is close to the lattice constant of the core is also referred to as "the shell with the lattice constant close to that of the semiconductor forming the core". For example, Ag—In—S, which is a Group 11-13-16 ternary semiconductor, generally has a tetragonal system. Examples of a crystal system that matches a tetragonal system include a tetragonal system and an orthorhombic system. When the Ag—In—S semiconductor has a tetragonal system, its lattice constants are 5.828 Å, 5.828 Å, and 11.19 Å. It is preferable that the shell covering this semiconductor has a tetragonal system or a cubic system whose lattice constant or a multiple of the lattice constant is close to the lattice constant of Ag—In—S semiconductor. Alternatively, the shell may be amorphous.

Whether the amorphous shell is formed or not can be confirmed by observing the core-shell semiconductor nanoparticles of this embodiment with a high-angle annular dark field (HAADF)-scanning transmission electron microscope (STEM). More specifically, in an HAADF-STEM image, a portion with a regular pattern (e.g., a striped pattern or a dot pattern) is observed at the center, while a portion with no regular pattern is observed at the periphery of the portion with the regular pattern. With the HAADFE-STEM, a regular structure, such as crystal material, is observed as an image with a regular pattern, while a non-regular structure, such as amorphous material, is not observed as an image with a regular pattern. For this reason, when the shell is amorphous, the shell can be observed as a part definitely different from the core, which is observed as an image with a regular pattern (as it has the crystal structure, such as a tetragonal system, as mentioned above).

When the core is made of Ag—In—S, and the shell is made of GaS, in the image obtained by the HAADF-STEM, the shell tends to be observed as an image part darker than that of the core because Ga is an element with a weight smaller than each of Ag and In.

Whether the amorphous shell is formed or not can also be confirmed by observing the core-shell semiconductor nanoparticles of the present embodiment with a high-resolution transmission electron microscope (HRTEM). In an image obtained by the HRTEM, the core part is observed as a crystal lattice image (i.e., image with a regular pattern). In contrast, the shell part is not observed as a crystal lattice image. In the shell part, the contrast between white and black parts can be observed, but no regular pattern can be observed.

The shell preferably does not form a solid solution with the core. If the shell is solid-soluted with the core, both the core and shell are integrated into a single body. With this arrangement, a mechanism of the present embodiment, in which covering the core with the shell to modify the surface state of the core allows for exhibiting band-edge emission, is not obtained. For example, it is confirmed that the core made of Ag—In—S covered with zinc sulfide (Zn—S) having a stoichiometric composition or a non-stoichiometric composition does not exhibit band-edge emission from the core. Zn—S satisfies the above-described condition for the bandgap energy with regard to the relationship with Ag—In—S and forms the type-1 band alignment. Nevertheless, no band-edge emission is obtained from the above-described specific semiconductor. It is assumed that this is because ZnS and the above-described specific semiconductor form a solid solution, which eliminates the interface between the core and the shell.

Examples of a combination of a Group 13 element and a Group 16 element of the shell may include a combination of In and S, a combination of Ga and S, and a combination of In and Ga and S. The combination is not limited thereto. The combination of In and S may be indium sulfide. The combination of Ga and S may be gallium sulfide. The combination of In, Ga and S may be indium gallium sulfide. In the present embodiment, indium sulfide forming the shell may not be stoichiometric (that is, $In_2S_3$), and thus may be represented by the formula of $InS_x$ (where x is any number that is not limited to an integer number, e.g., in a range of 0.8 to 1.5) in the present specification. Likewise, gallium sulfide may not be stoichiometric (that is, $Ga_2S_3$), and thus may be represented by the formula of $GaS_x$ (where x is any number that is not limited to an integer number, e.g., 0.8 to 1.5) in the present specification. Indium gallium sulfide may have a composition represented by $In_{2(1-y)}Ga_{2y}S_3$ (where y is any number that is greater than 0 and less than 1) or a composition represented by $In_aGa_{1-a}S_b$ (where a is an any number that is greater than 0 and less than 1, and b is any number that is not limited to integer number).

Indium sulfide has a bandgap energy of 2.0 eV to 2.4 eV. Indium sulfide with a cubic crystal system has a lattice constant of 10.775 Å. Gallium sulfide has a bandgap energy of 2.5 eV to 2.6 eV. Gallium sulfide with a tetragonal crystal system has a lattice constant is 5.215 A. All values about the crystal systems and the like described above are reported values, and thus values of the shell in actual core-shell semiconductor nanoparticles may not correspond with these reported values. In the case where the core is made of Group 11-13-16 ternary or quaternary semiconductors, in particular, Ag—In—S or Ag—In—Zn—S, indium sulfide and gallium sulfide are preferably used for a semiconductor forming the shell. In particular, gallium sulfide is preferably used because of its large bandgap energy. With use of gallium sulfide, band-edge emission stronger than that in the case of using indium sulfide can be obtained.

The surface of the shell may be modified by any appropriate compound. In the case where the surface of the shell is an exposed surface of the core-shell semiconductor nanoparticle, modification of the exposed surface allows for stabilizing the nanoparticle, and preventing the agglomeration and growth of the semiconductor nanoparticles, and/or improving the dispersibility of the semiconductor nanoparticles in the solvent.

Examples of a surface modifier may include a nitrogen-containing compound having a hydrocarbon group with a carbon number of 4 to 20, a sulfur-containing compound having a hydrocarbon group with a carbon number of 4 to 20, and an oxygen-containing compound having a hydrocarbon group with a carbon number of 4 to 20. Examples of the hydrocarbon group with the carbon number of 4 to 20 can include saturated aliphatic hydrocarbon groups, such as an n-butyl group, an isobutyl group, an n-pentyl group, an n-hexyl group, an octyl group, a decyl group, a dodecyl group, a hexadecyl group, and an octadecyl group; unsaturated aliphatic hydrocarbon groups, such as an oleyl group; alicyclic hydrocarbon groups, such as a cyclopentyl group and a cyclohexyl group; and aromatic hydrocarbon groups, such as a phenyl group, a benzyl group, a naphthyl group, and a naphthylmethyl group. Among them, the saturated aliphatic hydrocarbon groups and the unsaturated aliphatic hydrocarbon groups are preferable. Examples of nitrogen-containing compounds include amines and amides. Examples of sulfur-containing compounds include thiols. Examples of oxygen-containing compounds include fatty acids and the like.

The surface modifier is preferably a nitrogen-containing compound having the hydrocarbon group with the carbon number of 4 to 20. Examples of such a nitrogen-containing compound include alkyl amines, such as n-butyl amine, isobutyl amine, n-pentyl amine, n-hexyl amine, octyl amine, decyl amine, dodecyl amine, hexadecyl amine, and octadecyl amine, and alkenyl amines, such as oleyl amine. In particular, in view of easy availability of that of high purity and boiling point of greater than 290° C., n-tetradecylamine is preferably employed.

For the surface modifier, a sulfur-containing compound having the hydrocarbon group with the carbon number of 4 to 20 is preferably used. Examples of such a sulfur-containing compound include n-butanethiol, isobutanethiol, n-pentanethiol, n-hexanethiol, octanethiol, decanethiol, dodecanethiol, hexadecanethiol, and octadecanethiol.

For the surface modifier, a combination of two or more different surface modifiers may be used. For example, one compound (e.g., oleylamine) selected from the nitrogen-containing compounds exemplified above, and one compound (e.g., dodecanethiol) selected from the sulfur-containing compounds exemplified above may be used in combination.

Core-Shell Structure

In the description below, the structure of a core-shell semiconductor nanoparticle according to this embodiment, which is configured of the core and the shell as described above will be illustrated.

The core-shell semiconductor nanoparticles in the present embodiment may have an average particle size of 50 nm or less. The average particle size may be in a range of 1 nm to 20 nm, and particularly in a range of 1 nm to 10 nm.

The average particle size of the nanoparticles may be determined, for example, from a TEM image taken with a transmission electron microscope (TEM). More specifically, the particle size of a nanoparticle refers to, in the TEM image, the longest one of line segments that connects any two points at the outer periphery of a single particle and passes through the center of the particle.

In the case where the particle has a rod shape, the particle size thereof refers to the length of the short axis. In the present specification, the expression "rod-shaped" refers to a shape that is observed to have a quadrangular shape such as a rectangular shape (with a cross section of a circular shape, an elliptical shape, or a polygonal shape), an elliptical shape, or a polygonal shape (for example, a pencil-like shape), and have a ratio of the long axis to the short axis of more than 1.2. The "long axis" of a rod-shaped particle having an elliptical shape refers to the length of the longest one of line segments each connecting any two points on the periphery of the particle. Also, the "long axis" of a rod-shaped particle having a quadrangular or polygonal shape refers to the length of the longest one of line segments that are in parallel with the longest side of the sides defining the periphery of the particle and connect two points on the periphery of the particle. Meanwhile, the "short axis" indicates the length of the longest one of line segments that are perpendicular to the line segment defining the long axis and connect two points on the periphery of the particle.

The average particle size is an arithmetic average of the particle sizes determined by taking TEM images of the nanoparticles at a magnification of 50,000× to 150,000× at three or more sites on a grid appropriately selected, and measuring the particle sizes of all the measurable nanoparticles observed in the obtained TEM images. Here, the "measurable particle" refers to a particle which can be observed as a whole in the TEM image. Thus, a particle that is partially "cut" or not included in an image range is not regarded as a "measureable particle". The number of TEM images is selected to be three or more, and the total of the number of nanoparticles included in the selected TEM images is selected to be 100 or greater. Thus, in the case where 100 or more nanoparticles are shown in three TEM images but actually less than 100 nanoparticles are present, it is necessary to increase the number of sites to be captured. Alternatively, even though 100 or more nanoparticles in total are shown in two TEM images, three or more TEM images is used to measure the average particle size of the nanoparticles.

In the core-shell semiconductor nanoparticle, the core may have an average particle size of, for example, 10 nm or less, and particularly, 8 nm or less. The average particle size of the core may be in a range of 2 nm to 10 nm, particularly 2 nm to 8 nm, more particularly 2 nm to 6 nm, or alternatively in a range of 4 nm to 10 nm or in a range of 5 nm to 8 nm. If the average particle size of the core is too large, the quantum size effect is not easily exhibited, so that band-edge emission is not easily obtained.

The shell may have a thickness of 0.1 nm or more. The thickness of the shell may be in a range of 0.1 nm to 50 nm, particularly 0.1 nm to 20 nm, and more particularly 0.2 nm to 10 nm. Alternatively, the thickness of the shell may be in a range of 0.1 nm to 3 nm, and particularly 0.3 nm to 3 nm. If the thickness of the shell is too small, the effect obtained by coating the core with the shell may not be sufficiently exhibited, so that band-edge emission is not easily obtained.

The average particle size of the core and the thickness of the shell may be determined by observing the core-shell semiconductor nanoparticle, for example, with the HAADF-STEM. In particular, in the case where the shell is amorphous, the shell is easily observed as a different part from the core, so that the thickness of the shell can be determined easily using the HAADF-STEM. In that case, the particle size of the core can be determined by the method described above for that of the semiconductor nanoparticle. In the case where the thickness of the shell is not uniform, the thickness of the shell in the particle refers to the smallest thickness among the measured values.

Alternatively, the average particle size of the core may be measured in advance before being coated with the shell. Then, an average particle size of the core-shell semiconductor nanoparticles may be measured. Subsequently, a difference between the average particle size of the core-shell semiconductor nanoparticles and the average particle size of the core measured in advance may be calculated to determine the thickness of the shell.

The semiconductor nanoparticles of the present embodiment emit photoluminescence upon being irradiated with light. More specifically, when irradiated with ultraviolet light, visible light, or infrared light, the semiconductor nanoparticles emit light with a wavelength longer than that of the irradiated light. The semiconductor nanoparticles in the present embodiment may emit fluorescence or light containing fluorescence. In that case, the semiconductor nanoparticles in the present embodiment can serve as a phosphor for emitting fluorescence. In the semiconductor nanoparticles according to the present embodiment, the core is coated with the shell containing elements of specific Groups, allowing for producing band-edge emission from the core that would otherwise fail to generate band-edge emission if the core is not covered with the shell. More specifically, upon being irradiated with ultraviolet light, visible light, or infrared light, the semiconductor nanoparticles in the present embodiment can emit photoluminescence having a wavelength longer than that of the irradiated light, having a main element whose photoluminescence lifetime is 200 ns or less, and/or having a full width at half maximum of an photoluminescence spectrum of 50 nm or less. The term "photoluminescence lifetime" as used herein refers to a lifetime of photoluminescence measured by a device, called fluorescence lifetime measurement device, as will be described in Examples below.

The value of "photoluminescence lifetime of the main component" is determined in the procedure described below. First, semiconductor nanoparticles are irradiated with an excitation light to emit photoluminescence. Observing light with wavelengths around the peak of the emission spectrum, for example, in a range of (peak wavelength ±50 nm), a change in the decay of the light (afterglow) is measured over time. The measurement of the change over time starts from a timing when the irradiation with the excitation light is stopped. In general, a decay curve is the sum of a plurality of decay curves derived from relaxation processes of such as photoluminescence emission or heat. Thus, in the present embodiment, on the assumption that the obtained decay curve contains three components (i.e., three decay curves), parameter fitting is performed such that the three-component decay curve is represented by the following formula where I(t) represents intensity of photoluminescence. The parameter fitting is performed using a dedicated software.

$$I(t) = A_1 \exp(-t/\tau_1) + A_2 \exp(-t/\tau_2) + A_3 \exp(-t/\tau_3)$$

In the above formula, each of $\tau_1$, $\tau_2$, and $\tau_3$ of the components represents the time required for attenuation of the light intensity to 1/e (36.8%) of the corresponding initial level, which corresponds to the photoluminescence lifetime of each component. The times $\tau_1$, $\tau_2$, and $\tau_3$ are named in the increasing order of the photoluminescence lifetime. $A_1$, $A_2$, and $A_3$ represent contribution rates of the respective components. In the present embodiment, when the component having the maximum integral of the curve represented by $A_x \exp(-t/\tau_x)$ is assumed as the main component, the photoluminescence lifetime $\tau$ of the main component is 200 ns or less. Such photoluminescence is assumed to be the band-edge emission. When identifying the main component, the values $A_x \times \tau_x$ of the components, which are obtained by integrating $A_x \exp(-t/\tau_x)$ from 0 to infinity with respect to t, are compared to one another, and then the component with the largest $A_x \times \tau_x$ is determined as the main component. In this embodiment, the decay curves obtained by performing the parameter fitting assuming that the decay curve contains three, four, or five components, respectively, do not greatly differ from each other in terms of the deviation from an actual decay curve. For this reason, in the present embodiment, the number of components included in the decay curve of photoluminescence is assumed to be three when the photoluminescence lifetime of the main component is determined, allowing for avoiding the complexity of the parameter fitting.

The band-edge emission may be obtained together with defect luminescence. The defect luminescence generally has a long photoluminescence lifetime and shows a broad spectrum whose peak is positioned on the longer-wavelength side with respect to the band-edge emission. Alternatively, the semiconductor nanoparticles in the present embodiment may emit only the defect luminescence without any band-edge emission. Even with such semiconductor nanoparticles, the shell covering the core allows for removing an electric defect on the surface of the core. Thus, the semiconductor nanoparticles can be applied as a material suitably used to conduct charge separation and to suppress recombination for photoelectric conversion (in particular, a constituent material of a solar battery).

Intensity of the band-edge emission and the position of the peak of the band-edge emission from the semiconductor nanoparticles in the present embodiment can be changed by adjusting the particle size of the semiconductor nanoparticle. For example, by decreasing the particle size of the semiconductor nanoparticle, the intensity of the band-edge emission (ratio of intensity of the band-edge emission/intensity of defect luminescence) can be further increased. When the particle size of the semiconductor nanoparticle is further decreased, the peak wavelength of the band-edge emission tends to be shifted toward the short-wavelength side. Furthermore, when the particle size of the semiconductor nanoparticle is further decreased, a full width at half maximum of the spectrum of the band-edge emission tends to be decreased.

The semiconductor nanoparticles of the present embodiment preferably has absorption spectrum or excitation spectrum (also referred to as a "fluorescence excitation spectrum") in which an exciton peak is present. The exciton peak is a peak obtained by generation of an exciton. The presence of this peak in the absorption spectrum or excitation spectrum indicates that the semiconductor nanoparticles have the small distribution of particle sizes and has less crystal defects, and thus they are suitable for the band-edge emission. The sharper the exciton peak is, the greater amount of particles having uniform particle size and less crystal defects the aggregate of semiconductor nanoparticles contains. This is assumed to narrow the full width at half maximum of the photoluminescence from the nanoparticles, thereby improving the luminous efficiency. In the absorption spectrum or excitation spectrum of the semiconductor nanoparticles in this embodiment, the exciton peak is observed, for example, in region between 350 nm and 1,000 nm. The excitation spectrum for observing the presence of the exciton peak may be measured at an observation wavelength in the vicinity of the peak wavelength.

Method of Producing Core-Shell Semiconductor Nanoparticles

The method of producing the core-shell semiconductor nanoparticles in this embodiment includes:

providing a dispersion by dispersing semiconductor nanoparticles each of which is to be the core (hereinafter the core before being coated with a shell is referred to as "primary semiconductor nanoparticles" for convenience) into a solvent; and adding, to the dispersion, a compound containing a Group 13 element as a source thereof and an elemental substance of a Group 16 element or a compound containing a Group 16 element as a source thereof to form a semiconductor layer consisting essentially of the Group 13 element and the Group 16 element on the surface of each of the primary semiconductor nanoparticles.

Preparation of Primary Semiconductor Nanoparticles

The primary semiconductor nanoparticle corresponds to the core as described above. When the core is a ternary semiconductor, the primary semiconductor nanoparticle is a nanoparticle made of a semiconductor that contains $M^1$, $M^2$, and $Z$. When the core is a quaternary semiconductor, the primary semiconductor nanoparticle is a nanoparticle made of a semiconductor that contains $M^1$, $M^2$, $M^3$, and $Z$. For the primary semiconductor nanoparticles, a commercially available product may be used, or one produced on a trial basis may be used. Alternatively, the primary semiconductor nanoparticles may be produced by reacting an $M^1$ source, an $M^2$ source, and a $Z$ source, and optionally, an $M^3$ source. In the production method according to the present embodiment, coating with the shell may not necessarily be performed immediately after producing or providing the primary semiconductor nanoparticles. Primary semiconductor nanoparticles that are separately produced and left for a while may be used.

For example, the ternary primary semiconductor nanoparticles may be produced by a method in which a salt of the element $M^1$, a salt of the element $M^2$, and a ligand containing the element $Z$ as a coordination element are mixed to give a complex, and then the complex is heat-treated. Any kinds of a salt of $M^1$ and a salt of $M^2$ may be employed, and either an organic acid salt or an inorganic acid salt may be employed. More specifically, the salt may be any one of a nitrate salt, an acetate salt, a hydrosulfate salt, a hydrochloride salt, and a sulfonate salt, and is preferably an organic acid salt, such as an acetate salt. This is because the organic acid salt has high solubility in an organic solvent, which allows the reaction to proceed uniformly.

When $Z$ is sulfur (S), examples of the ligand containing the element $Z$ as the coordination element include β-dithiones, such as 2,4-pentanedithione; dithiols, such as 1,2-bis (trifluoromethyl)ethylene-1,2-dithiol; diethyldithiocarbamate; and thiourea.

When $Z$ is tellurium (Te), examples of the ligand containing the element $Z$ as the coordination element include diallyl telluride, and dimethyl ditelluride. When $Z$ is selenium (Se), examples of the ligand containing the element $Z$ as the coordination element include dimethyldiselenocarbamic acid, and 2-(dimethylamino)ethaneselenol.

The complex is obtained by mixing the salt of $M^1$, the salt of $M^2$, and the ligand containing the element $Z$ as the coordination element. The complex may be formed by a method in which an aqueous solution containing the salt of $M^1$ and the salt of $M^2$ is mixed with an aqueous solution of the ligand, or alternatively by a method in which the salt of $M^1$, the salt of $M^2$, and the ligand are introduced into an organic solvent (in particular, an organic solvent with high polarity, such as ethanol) and then mixed. The organic solvent may be the surface modifier or a solution containing the surface modifier. The charging ratio of the salt of $M^1$, the salt of $M^2$, and the ligand containing the element $Z$ as the coordination element is preferably set at 1:1:2 (in terms of molar ratio) corresponding to the composition of $M^1M^2Z_2$.

Next, the obtained complex is subjected to heat treatment to form the primary semiconductor nanoparticles. More specifically, the heat treatment of the complex may be performed by precipitating the obtained complex to separate the complex from the solvent, followed by drying it into powder, and heating the powder, for example, at a temperature in a range of 100° C. to 300° C. In this case, preferably, the obtained primary semiconductor nanoparticles are subjected to another heat treatment in a solvent, which is the surface modifier, or a solvent containing a surface modifier, so that the surfaces of the nanoparticles are modified. Alternatively, the heat treatment of the complex may be performed by heating the complex obtained in the form of powder in a solvent which is the surface modifier or a solvent containing the surface modifier, for example, at a temperature in a range of 100° C. to 300° C. Alternatively, in the case where the complex is formed by introducing the salt of $M^1$, salt of $M^2$, and the ligand into an organic solvent and mixing these, the salts and the ligand may be introduced into the organic solvent, which is a surface modifier or a solvent containing the surface modifier, and then subjected to the heat treatment, which allows for continuously or simultaneously performing the complex formation, the heat treatment, and the surface modification.

Alternatively, the primary semiconductor nanoparticles may be formed by introducing the salt of $M^1$, the salt of $M^2$, and a source compound of Z into an organic solvent. Alternatively, the primary semiconductor nanoparticles may be produced by a method that includes forming a complex by a reaction between the organic solvent and the salt of $M^1$, forming another complex by a reaction between the organic solvent and the salt of $M^2$, reacting these complexes with the source compound of Z to produce a reaction product, and growing crystals of the obtained reaction product. The salt of $M^1$ and the salt of $M^2$ have been described above in relation to the production method including the formation of complex. Examples of the organic solvent for forming the complex by reaction with these salts include alkylamines, alkenylamines, alkylthiols, alkenylamine, alkylphosphines, and alkenylphosphines having the carbon number of 4 to 20. These organic solvents finally serve to modify the surfaces of the obtained primary semiconductor nanoparticles. Such organic solvents may be used mixed with other organic solvents. Also in this production method, the charging ratio of the salt of $M^1$, the salt of $M^2$, and the source compound of Z is preferably 1:1:2 (in terms of molar ratio) corresponding to the composition of $M^1M^2Z_2$.

When Z is sulfur (S), examples of a source compound of Z include sulfur, thiourea, thioacetamide, and alkylthiol. When Z is tellurium (Te), for example, a suspension in which Te powder is added into a trialkylphosphine is subjected to heat treatment at a temperature in a range of 200° C. to 250° C. to produce a Te-phosphine complex, which may be used as the source compound of Z. When Z is selenium (Se), for example, a suspension in which Se powder is added into a trialkylphosphine is subjected to heat treatment at a temperature of 200° C. to 250° C. to produce a Se-phosphine complex, which may be used as the source compound of Z.

Alternatively, primary semiconductor nanoparticles may be produced by using a so-called hot-injection method. The hot-injection method is a method of producing semiconductor nanoparticles in which a solution (also called as a precursor solution) into which source compounds of respective elements for forming primary semiconductor nanoparticles (e.g., a salt of $M^1$, a salt of $M^2$, and a source compound of Z or a ligand containing the element Z as the coordination element) are dissolved or dispersed is charged into a solvent heated at a temperature in a range of 100° C. to 300° C. for a short time (e.g. milliseconds order), thereby forming a number of crystal nuclei in an initial reaction stage. Alternatively, the hot-injection method may involve: dissolving or dispersing source compounds of some of the elements in an organic solvent, followed by heating it; and subsequently charging a precursor solution of the remaining elements into the organic solvent. In the case where the solvent is the surface modifier, or a solvent containing the surface modifier, the modification of the surfaces of the particles can be performed simultaneously. With such a hot-injection method, the nanoparticles each with a smaller particle size can be manufactured.

The surface modifier for modifying the surface of each of the primary semiconductor nanoparticles has been described above in relation to the shell. With the primary semiconductor nanoparticles each having the modified surface, the particles are stabilized, which can prevent the agglomeration or growth of the particles, and/or can improve the dispersibility of the particles in the solvent. In the case where the surfaces of the primary semiconductor nanoparticles are modified, the growth of the shell starts when the surface modifier is removed. Thus, generally, the surface modifier that modifies the primary semiconductor nanoparticles is not present on the surface of the core (at the interface between the core and shell) in the core-shell nanoparticles finally obtained.

In the case of employing any of these methods, the primary semiconductor nanoparticles are produced under an inert atmosphere, particularly, under an argon atmosphere or a nitrogen atmosphere. This is for reducing or preventing the subgeneration of oxides and the oxidation of the surface of the primary semiconductor nanoparticle.

In the case where the primary semiconductor nanoparticles are formed to further contain the element $M^3$, in addition to the elements $M^1$ and $M^2$ and the element Z, i.e., when the primary semiconductor nanoparticles are made of the quaternary semiconductor, a salt of $M^3$ is used together with the salt of $M^1$, and the salt of $M^2$ in the production of the primary semiconductor nanoparticles mentioned above. The charging ratio of the salt of $M^1$, the salt of $M^2$, the salt of $M^3$, and the ligand containing the element Z as the coordination element or the source compound of Z is preferably x:x:y:2 (in terms of molar ratio) that corresponds to a composition formula of the stoichiometric composition, namely, $(M^1M^2)_xM^3_y\text{Te}_2$ (where x+y=2). The salt of $M^3$ may be either an organic acid salt or an inorganic acid salt. More specifically, the salt of $M^3$ may be any one of a nitrate salt, an acetate salt, a hydrosulfate salt, a hydrochloride salt, and a sulfonate salt. Other configurations regarding the method of producing the quaternary primary semiconductor nanoparticles are substantially the same as that for the ternary primary semiconductor nanoparticles, and thus its detailed description will be omitted.

In the case where a part of $M^2$ of the ternary or quaternary semiconductor nanoparticles is substituted with another metal element, a salt of another metal element is used at the time of producing the primary semiconductor nanoparticles. In this case, the charging ratio of the salt of $M^2$ and the salt of the metal element is adjusted such that the substitution amount of the metal element is at a desired value. Likewise, in the case of producing the quaternary semiconductor nanoparticles having a composition in which a part of $M^3$ is substituted with another metal element, the salt of another metal element is used in producing of the primary semiconductor nanoparticles.

The ternary or quaternary semiconductor nanoparticles produced in the above-described manner may be separated from the solution after the end of the reaction, and may be refined as needed. The separation is performed, for example, by centrifuging a suspension after producing the particles, and taking out a supernatant. The refinement is performed by adding alcohol to the supernatant, centrifuging the supernatant to generate precipitates, taking out the precipitates (or removing the supernatant), and then drying the separated precipitates, for example, by vacuum deaeration or natural drying, or dissolving the precipitates in an organic solvent. The refinement (including the addition of alcohol and the centrifugation) may be performed a plurality of times as needed. Examples of an alcohol for use in the refinement include a lower alcohol, such as methanol, ethanol, and n-propanol. In the case of dissolving the precipitates in an organic solvent, examples of organic solvents include chloroform, toluene, cyclohexane, hexane, pentane, and octane.

In the case of drying the separated precipitates after the refinement, the drying may be performed, for example, by vacuum deaeration or natural drying, or alternatively, by a combination of the vacuum deaeration and natural drying. The natural drying may be performed, for example, by leaving the particles in the atmosphere at normal temperature and pressure. In this case, the particles are left for 20 hours or more, for example, for approximately 30 hours.

Dispersion of Primary Semiconductor Nanoparticles

In the covering of the primary semiconductor nanoparticles with the shell, the primary semiconductor nanoparticles are dispersed in an appropriate solvent to prepare a dispersion. Subsequently, in the dispersion, a semiconductor layer is formed as the shell. Light-scattering does not occur in the liquid in which the primary semiconductor nanoparticles are dispersed. Thus, the obtained dispersion is generally transparent (colored or colorless). Any appropriate solvent may be used for dispersing the primary semiconductor nanoparticles thereinto. As in the production of the primary semiconductor nanoparticles, an appropriate organic solvent (in particular, an organic solvent with high polarity, such as ethanol) may be used. The organic solvent may be the surface modifier or a solution containing the surface modifier. For example, the organic solvent may be at least one selected from nitrogen-containing compounds having a hydrocarbon group with the carbon number of 4 to 20; or at least one selected from sulfur-containing compounds having a hydrocarbon group with the carbon number of 4 to 20; or a combination of at least one selected from the nitrogen-containing compounds having a hydrocarbon group with the carbon number of 4 to 20 and at least one selected from the sulfur-containing compounds having a hydrocarbon group with the carbon number of 4 to 20. These exemplified compounds are described as the surface modifier in relation to the shell. As the nitrogen-containing compound, n-tetradecylamine is preferable in view of easy availability of a high-purity one and boiling point of greater than 290° C. More specifically, examples of the organic solvent include oleylamine, n-tetradecylamine, dodecanethiol, and combinations thereof.

The dispersion of the primary semiconductor nanoparticles may be adjusted such that the proportion of the nanoparticles in the dispersion is, for example, 0.02% by mass to 1% by mass, and particularly 0.1% by mass to 0.6% by mass. If the proportion of the particles in the dispersion is too low, products are difficult to be collected in aggregation and precipitation processes by a poor solvent. If the proportion of the particles in the dispersion is too high, rate of Ostwald ripening and fusion of particles of the materials forming the core may be increased, which tends to widen the particle size distribution.

Formation of Shell

The formation of the semiconductor layer as the shell is performed by adding a compound containing a Group 13 element and either an elemental substance of a Group 16 element or a compound containing a Group 16 element to the dispersion described above. The compound containing the Group 13 element serves as a Group 13 element source, and is, for example, an organic salt, an inorganic salt, an organometallic compound of the Group 13, etc. More specifically, examples of the compound containing the Group 13 element include nitrate salts, acetate salts, sulfate salts, hydrochloride salts, sulfonate salts, and acetylacetonato complexes, and preferably organic salts, such as acetate salts, or organometallic compounds. This is because the organic salt and organometallic compound have high solubility into the organic solvent, which can facilitate uniformly proceeding the reaction.

An elemental substance of the Group 16 element or a compound containing the Group 16 element serves as a Group 16 element source. For example, in the case where sulfur (S) is a constituent element of the shell as the Group 16 element, the elemental sulfur, such as high-purity sulfur, can be used, or sulfur-containing compounds can be used. Examples of such a sulfur-containing compound include thiols, such as n-butanethiol, isobutanethiol, n-pentanethiol, n-hexanethiol, octanethiol, decanethiol, dodecanethiol, hexadecanethiol, and octadecanethiol; disulfides such as dibenzyldisulfide; thiourea; and thiocarbonyl compounds.

In the case where oxygen (O) is a constituent element of the shell as the Group 16 element, alcohols, ethers, carboxylic acids, ketones, or N-oxide compounds may be used as a Group 16 element source. In the case where selenium (Se) is a constituent element of the shell as the Group 16 element, an elemental selenium, or compounds, such as selenized phosphine oxides, organic selenium compounds (dibenzyldiselenide, diphenyldiselenide) or selenium hydrides, may be used as a Group 16 element source. In the case where tellurium (Te) is a constituent element of the shell as the Group 16 element, an elemental tellurium, tellurium phosphine oxides, or tellurium hydrides, may be used as a the Group 16 element source.

Any appropriate method may be employed for adding the Group 13 element source and the Group 16 element source into the dispersion. For example, a mixture in which a Group 13 element source and a Group 16 element source may be dispersed or dissolved into an organic solvent. Then, the mixture may be added to a dispersion little by little, for example, by dropping. In this case, the mixture may be added at a rate of 0.1 mL/hr to 10 mL/hr, and particularly at a rate of 1 mL/hr to 5 mL/hr. The mixture may be added to the heated dispersion. More specifically, for example, temperature of the dispersion may be increased to a peak temperature of 200° C. to 290° C. After reaching the peak temperature, the mixture may be added little by little to the dispersion while holding the peak temperature, followed by decreasing the temperature of the dispersion with the mixture added, so that a shell layer may be formed (namely, a slow injection method). The peak temperature may be held if necessary even after the addition of the mixture is finished.

If the peak temperature is too low, the surface modifier that modifies the primary semiconductor nanoparticles cannot be removed sufficiently, or a chemical reaction for forming the shell does not proceed sufficiently. For these reasons, the semiconductor layer (shell) is not formed sufficiently in some cases. On the other hand, if the peak temperature is extremely high, the primary semiconductor nanoparticles sometimes have their quality altered, whereby even the formation of the shell cannot produce the band-edge emission in some cases. The time for holding the peak temperature may be set from one minute to 300 minutes, and particularly 10 minutes to 60 minutes in total after the start of the addition of the mixture. The time for holding at the peak temperature (i.e., temperature holding time) is selected in view of the relationship with the peak temperature. When the peak temperature is lower, the temperature holding time is increased. When the peak temperature is higher, the temperature holding time is decreased. In these manners, good shell layer can be easily formed. The temperature increasing rate and the temperature decreasing rate are not particularly limited. Decreasing of the temperature may be performed, for example, by holding the dispersion in which the mixture is added at the peak temperature for a predetermined time and then allowing the dispersion to cool by turning off a heating source (e.g., electric heater).

Alternatively, whole amounts of the Group 13 element source and the Group 16 element source may be added directly to the dispersion. Then, the dispersion to which the Group 13 element source and the Group 16 element source are added may be heated, so that the semiconductor layer can be formed as the shell on the surfaces of the primary semiconductor nanoparticles (namely, a heating-up method). More specifically, the temperature of the dispersion into which the Group 13 element source and the Group 16 element source are added may be gradually increased to a peak temperature of 200° C. to 290° C. After holding at the peak temperature for one to 300 minutes, the temperature of the dispersion may be gradually decreased. The temperature increasing rate may be set, for example, at 1° C./min to 50° C./min, and the temperature decreasing rate may be set, for example, to 1° C./min to 100° C./min. Alternatively, heating may be performed to a predetermined peak temperature without controlling the temperature increasing rate. Alternatively, the temperature decreasing may not be performed at a constant rate. The temperature decreasing may be performed by turning off the heating source. The issues in the case of the excessively low peak temperature or excessively high peak temperature has been described in description of the method of adding the mixture.

With the heating-up method, the core-shell semiconductor nanoparticles tend to be obtained, with band-edge emission of an intensity higher than that of the core-shell semiconductor nanoparticles in which the shell is formed by the slow-injection method.

The charging ratio of the Group 13 element source and the Group 16 element source preferably corresponds to the stoichiometric compositional ratio of the compound semiconductor consisting of the Group 13 element and the Group 16 element in any method of adding the Group 13 element source and the Group 16 element source. For example, in the case of using an In source as the Group 13 element source and a S source as the Group 16 element source, the charging ratio is preferably 1:1.5 (In:S) corresponding to a composition formula of $In_2S_3$. Similarly, in the case of using a Ga source as the Group 13 element source and a S source as the Group 16 element source, the charging ratio is preferably 1:1.5 (Ga:S) corresponding to the composition formula of $Ga_2S_3$. However, the charging ratio may not necessarily be the stoichiometric compositional ratio. In the case where the raw material is charged with an excessive amount compared to the intended produced amount of the shell, the amount of the Group 16 element source may be smaller than the stoichiometric compositional ratio. For example, the charging ratio may be 1:1 (the Group 13:the Group 16).

The charging amount is selected in view of an amount of the primary semiconductor nanoparticles contained in a dispersion such that the shell with a desired thickness is formed on the primary semiconductor nanoparticles contained in the dispersion. For example, the charging amounts of the Group 13 element source and the Group 16 element source may be selected such that the 0.01 mmol to 10 mmol, particularly 0.1 mmol to 1 mmol of the compound semiconductor consisting of the Group 13 element and the Group 16 element with stoichiometric composition is synthesized for the 10 nmol of the primary semiconductor nanoparticles, at amount of particles. The "amount of particles" refers to a molar amount assuming that the single particle is a giant molecule, and is equal to a value obtained by dividing the number of the nanoparticles contained in the dispersion by Avogadro number ($N_A$=6.022×10$^{23}$).

In the production method according to the present embodiment, it is preferable to form the shell containing indium sulfide or gallium sulfide by using indium acetate or gallium acetylacetonate as the Group 13 element source, and using elemental sulfur or dibenzyldisulfide as the Group 16 element source, and using n-tetradecylamine as the dispersant.

With use of the dibenzyldisulfide for the Group 16 element source (sulfur source) in the heating-up method, the shell is sufficiently formed and the semiconductor nanoparticles giving intense band-edge emission are easily obtained, even if the temperature holding time after reaching the peak temperature is short (for example, 20 minutes to 30 minutes). In the case of using the elemental sulfur to form the shell, a short temperature holding time after reaching the peak temperature may lead to difficulty in obtaining the semiconductor nanoparticles giving intense band-edge emission.

However, increasing the temperature holding time (for example, 40 minutes or longer, particularly 50 minutes or longer, and the upper limit being, for example, 60 minutes or shorter) allows for easily obtaining the semiconductor nanoparticles with intense band-edge emission. Further, in the case where the elemental sulfur is used and the temperature holding time is increased, it is possible to obtain the semiconductor nanoparticles with band-edge emission with a photoluminescence intensity higher than that of the semiconductor nanoparticles produced using dibenzyldisulfide. Furthermore, with the heating-up method in which elemental sulfur is used and the temperature holding time is increased, it is possible to obtain the semiconductor nanoparticles to exhibit photoluminescence spectra having a broad peak intensity due to defect luminescence that is sufficiently smaller than the peak intensity of the band-edge emission. Even further, the more the temperature holding time is increased irrespective of the types of sulfur sources, the more the peak of the band-edge emission emitted from the resultant semiconductor nanoparticles tends to be shifted toward the longer wavelength side. With use of n-tetradecylamine for the dispersion, it is possible to obtain the semiconductor nanoparticles having a broad peak intensity due to defect luminescence that is sufficiently smaller than the peak intensity of the band-edge emission. The above tendency is significantly observed in the case where the gallium source is used for the Group 13 element source.

The shell is formed in this manner, so that the core-shell semiconductor nanoparticles is formed. The obtained core-shell semiconductor nanoparticles may be separated from the solvent. Further, the core-shell semiconductor nanoparticles may be further refined and dried, if needed. The methods of separation, refinement and drying are as described in connection with the primary semiconductor nanoparticles, and thus their detailed description will be omitted.

Light-Emitting Device

As another embodiment, a light-emitting device will be described in which the core-shell semiconductor nanoparticles which have been described above is used. The light-emitting device according to the present embodiment is a light-emitting device including a light conversion member and a semiconductor light-emitting element, wherein the light conversion member contains the above-described core-shell semiconductor nanoparticles. In such a light-emitting device, for example, the core-shell semiconductor nanoparticles absorb a portion of light emitted from the semiconductor light-emitting element, and then emit light of a longer wavelength. Light from the core-shell semiconductor nanoparticles and the rest of light emitted from the semiconductor light-emitting element are mixed together, and the mixed light can then be used as the light emission from the light-emitting device.

More specifically, with the semiconductor light-emitting element configured to emit blue-violet or blue light with a peak wavelength of about 400 nm to about 490 nm and the core-shell semiconductor nanoparticles to absorb blue light and emit yellow light therefrom, a light-emitting device configured to emit white light can be obtained. Alternatively, with two kinds of core-shell semiconductor nanoparticles, of which one kind of core-shell semiconductor nanoparticles configured to absorb blue light and emit green light and the other kind of core-shell semiconductor nanoparticles configured to absorb blue light and emit red light, a white light-emitting device can be obtained. Further, alternatively, with a semiconductor light-emitting element configured to emit ultraviolet light with a peak wavelength of 400 nm or less, and three kinds of core-shell semiconductor nanoparticles that absorb the ultraviolet light and emit blue, green, and red lights, respectively, a white light-emitting device can be obtained. In this case, to avoid the leak of the ultraviolet light emitted from the light-emitting element toward the outside, the entirety of light from the light-emitting element is desirably absorbed and converted by the semiconductor nanoparticles.

Moreover, alternatively, with a light-emitting element configured to emit a blue-green light with a peak wavelength of about 490 nm to 510 nm and the core-shell semiconductor nanoparticles to absorb the blue-green light and emit red light, a device configured to emit white light can be obtained. Furthermore, alternatively, with a semiconductor light-emitting element configured to emit red light with a wavelength of 700 nm to 780 nm and the core-shell semiconductor nanoparticles to absorb the red light and emit near-infrared light, a light-emitting device configured to emit near-infrared light can be obtained.

The core-shell semiconductor nanoparticles may be used in combination with other semiconductor quantum dots, or any phosphors other than quantum dots (e.g., an organic phosphor or an inorganic phosphor). Other semiconductor quantum dots may be, for example, binary semiconductor quantum dots mentioned in the Background section in the present specification. For the phosphors other than quantum dots, garnet-based phosphors, such as an aluminum garnet-based phosphor, can be used. Examples of the garnet phosphors include an yttrium-aluminum-garnet-based phosphor activated by cerium, and a lutetium-aluminum-garnet-based phosphor activated by cerium. Examples of the phosphors other than quantum dots include a nitrogen-containing calcium aluminosilicate-based phosphor activated by europium and/or chromium; a silicate-based phosphor activated by europium; a nitride-based phosphor such as a β-SiAlON-based phosphor, a CASN-based phosphor, and a SCASN-based phosphor; a rare earth nitride-based phosphor such as $LnSi_3N_{11}$-based phosphor and a LnSiAlON-based phosphor; an oxynitride-based phosphor such as a $BaSi_2O_2N_2$:Eu-based phosphor and $Ba_3Si_6O_{12}N_2$:Eu-based phosphor; a sulfide-based phosphor such as a CaS-based phosphor, a $SrGa_2S_4$-based phosphor, a $SrAl_2O_4$-based phosphor, and a ZnS-based phosphor; a chlorosilicate-based phosphor; $SrLiAl_3N_4$:Eu phosphor; $SrMg_3SiN_4$:Eu phosphor; and $K_2SiF_6$:Mn phosphor as a fluoride complex phosphor activated by manganese may be used.

The light conversion member which contains the core-shell semiconductor nanoparticles in the light-emitting device may have, for example, a sheet-like shape or a plate-like shaped member, or may be a member with a three-dimensional shape. Examples of the member with the three-dimensional shape include a sealing member of a surface-mounted light-emitting diode in which a semiconductor light-emitting element is arranged at a bottom surface of a recess defined in a package. The sealing member is formed by charging resin into the recess to seal the light-emitting element.

Alternatively, other examples of the light conversion member include a resin member formed with a substantially uniform thickness to enclose upper surface and lateral surfaces of a semiconductor light-emitting element arranged on a planar substrate. Further, alternatively, in the case where a resin member which contains a reflective material is filled at the periphery of a semiconductor light-emitting element such that an upper end of the resin member is in the same plane with the semiconductor light-emitting element, further other examples of the light conversion member include a plate-shaped resin member with a predetermined thickness arranged on an upper side of the semiconductor light-emitting element and the above-described resin member which contains the reflective material.

The light conversion member may be in contact with the semiconductor light-emitting element, or may be disposed spaced from the semiconductor light-emitting element. More specifically, the light conversion member may be a pellet-shaped member, a sheet member, a plate-shaped member, or a stick-shaped member, which is disposed spaced from the semiconductor light-emitting element. Alternatively, the light conversion member may be a member which is disposed in contact with the semiconductor light-emitting element for example, a seal member, a coating member (i.e., member covering the light-emitting element disposed spaced from the mold member), or a mold member (e.g., including a lens-shaped member). In the case of using two or more kinds of core-shell semiconductor nanoparticles to exhibit photoluminescence with different wavelengths in the light-emitting device, one light conversion member may contain a mixture of the two or more kinds of core-shell semiconductor nanoparticles, or alternatively, a combination of two or more light conversion members, each of which contains only one kind of quantum dots, may be used. In this case, two or more kinds of light conversion members may be layered, or may be arranged on a plane in a dot-like or striped pattern.

Examples of the semiconductor light-emitting element include a light-emitting diode (LED) chip. The LED chip may include a semiconductor layer made of one or more kinds of compounds selected from the group consisting of GaN, GaAs, InGaN, AlInGaP, GaP, SiC, and ZnO. The semiconductor light-emitting element configured to blue-violet light, blue light, or ultraviolet light preferably includes, as a semiconductor layer, a GaN based compound represented by a general formula of $In_xAl_yGa_{1-X-Y}N$ ($0 \leq X$, $0 \leq Y$, $X+Y<1$).

The light-emitting device in this embodiment is preferably incorporated as a light source in a liquid crystal display device. Since the band-edge emission produced by the core-shell semiconductor nanoparticles has a short photoluminescence lifetime, the light-emitting device using this core-shell semiconductor nanoparticles is suitable for use as a light source for the liquid crystal display device that requires a relatively high response speed. The core-shell semiconductor nanoparticles in the present embodiment can exhibit the photoluminescence peak with a smaller full width at half maximum as the band-edge emission. Thus, the liquid crystal display device that exhibits excellent color reproducibility can be obtained without using a color filter with a dense color, if, in the light-emitting device:

the blue semiconductor light-emitting element is adapted to produce the blue light with a peak wavelength of 420 nm to 490 nm; and the core-shell semiconductor nanoparticles are adapted to produce the green photoluminescence with a peak wavelength of 510 nm to 550 nm, preferably 530 nm to 540 nm, and the red photoluminescence with a peak wavelength of 600 nm to 680 nm, preferably 630 nm to 650 nm, respectively; or the semiconductor light-emitting element is adapted to produce the ultraviolet light with a peak wavelength of 400 nm or less; and the core-shell semiconductor nanoparticles are adapted to produce the blue photoluminescence with a peak wavelength of 430 nm to 470 nm, preferably 440 nm to 460 nm, the green photoluminescence with a peak wavelength of 510 nm to 550 nm, preferably 530 nm to 540 nm, and the red photoluminescence with a peak wavelength of 600 nm to 680 nm, preferably 630 nm to 650 nm, respectively. The light-emitting device of this embodiment is used, for example, as a direct illumination-type backlight or an edge illumination-type backlight.

Alternatively, a sheet, a plate-shaped member, or a rod-shaped member made of a resin, glass, or the like, which contains the core-shell semiconductor nanoparticles, may be incorporated as a light conversion member independently from the light-emitting device, into a liquid crystal display device.

EXAMPLES

Example 1

(1) Production of Primary Semiconductor Nanoparticles (Ag—In—S)

First, 0.4 mmol of each of silver acetate (AgOAc) and indium acetate (In(OAc)$_3$), mmol of thiourea, 11.8 mL of oleylamine, and 0.2 mL of 1-dodecanethiol were charged into a two-necked flask and subjected to vacuum deaeration (for 3 minutes at normal temperature), followed by heating under an Ar atmosphere at a temperature increasing rate of up to 200° C. The obtained suspension was allowed to cool, followed by centrifugal separation (with a radius of 150 mm at 2,500 rpm for 10 minutes), so that a supernatant dark red liquid was taken out. Then, methanol was added to the supernatant solution until nanoparticles were precipitated, followed by centrifugal separation (with a radius of 150 mm at 2,500 rpm for 3 minutes). Then, the precipitates were dried at the normal temperature under vacuum, thereby producing semiconductor nanoparticles (primary semiconductor nanoparticles).

An XRD pattern of the obtained primary semiconductor nanoparticles was measured and compared with an XRD pattern of AgInS$_2$ having a tetragonal system (of a chalcopyrite type), an XRD pattern of AgInS$_2$ having a hexagonal system (of a wurtzite type), and an XRD pattern of AGInS$_2$ having an orthorhombic system. The measured XRD pattern is shown in FIG. 1. The XRD pattern shows that the crystal structure of the primary semiconductor nanoparticles is substantially the same as the tetragonal AgInS$_2$. The XRD pattern was measured using a powder X-ray diffractometer manufactured by RIGAKU Corporation (trade name: Smart-Lab). Note that the same goes for the Examples in the below.

The shapes of the obtained primary semiconductor nanoparticles were observed using a transmission electron microscope (TEM, manufactured by HITACH HIGH-TECHNOLOGIES Corporation, trade name: H-7650), and the average particle size was measured from TEM images at a magnification of 80,000× to 200,000×. Here, the TEM grid available under the trade name High Resolution Carbon HRC-C10 STEM Cu100P grid (manufactured by OKEN-SHOJI Co., Ltd.) was used. The shape of the obtained particles was spherical or polygonal. An average particle size was determined by selecting three or more TEM images, then measuring the particle sizes of all measurable nanoparticles included in these selected images, i.e., all particles except for nanoparticles whose images were cut at the edges of the images, and calculating an arithmetic average of the measured particle sizes. In all Examples herein, including Example 1 and Comparative Examples, three or more TEM images were used to measure the particle sizes of 100 or more nanoparticles in total. The average particle size of the primary semiconductor nanoparticles was 5.3 nm.

The substance amount of indium contained in the primary semiconductor nanoparticles obtained in the above production step (1) was measured by an inductively coupled plasma (ICP) emission spectroscopy (using ICPS-7510 (trade name) manufactured by SHIMAZU Corporation). As a result, the substance amount of indium was 52.2 µmol. In the case where the primary semiconductor nanoparticles each has a spherical shape, the volume of each of the primary nanoparticles having an average particle size of 5.3 nm was calculated to be 77.95 nm$^3$. In the case where silver indium sulfide crystal has a tetragonal system, the unit cell volume of the silver indium sulfide crystal is calculated to be 0.38 nm$^3$ (lattice constant: 5.828 Å, 5.828 Å, and 11.19 Å). Accordingly, by dividing the volume of each of the primary semiconductor nanoparticle by the unit cell volume, one particle of the primary semiconductor nanoparticles was determined to contain 205 unit cells. Next, since one unit cell of the silver indium sulfide crystal having the tetragonal system contains four indium atoms, one nanoparticle was calculated to contain 820 indium atoms. By dividing the substance amount of indium by the number of indium atoms per nanoparticle, the amount of the primary semiconductor nanoparticles was determined to be 63.6 nmol at amount of nanoparticles.

(2) Covering with Shell

Using the primary semiconductor nanoparticles obtained in the step (1), 20 nmol of the primary semiconductor nanoparticles at amount of nanoparticles was dispersed into a mixed solvent that contained 5.9 mL of oleylamine and 0.1 mL of dodecanethiol to obtain a dispersion. The obtained dispersion was held at 200° C. under an Ar atmosphere.

Separately from this, 0.8 mmol (233 mg) of indium acetate (In(OAc)3) and 1.2 mmol (38.4 mg) of sulfur powder were added to 8 mL of oleylamine, and then stirred at 100° C. for 10 minutes, so that the indium acetate and sulfur powder were dissolved to produce a mixture. Then, 5 ml of the mixture was dropped into the above-mentioned heated dispersion at a rate of 5 mL/h (at 0.5 mmol/h based on In). When the addition of the mixture is finished, the heating source was turned off, allowing the solution containing the dispersion into which the mixture is added to cool down to the room temperature. Subsequently, methanol was added to the solution, so that precipitates of the core-shell semiconductor nanoparticles were obtained. Then, solid components were collected from the solution by centrifugal separation (with a radius of 150 mm at 2,500 rpm for 3 minutes). The solid components were dissolved into chloroform, and thereafter various properties of the obtained core-shell semiconductor nanoparticles were measured. Upon measuring an average particle size of particles covered with the shell, the average particle size of the core-shell semiconductor nanoparticles was 11.4 nm and that an average thickness of the shell was approximately 3.0 nm based on a difference in the average particle size between the primary semiconductor nanoparticles and the core-shell semiconductor nanoparticles.

(3) Measurement of Absorption, Emission, and Excitation Spectra

Figure 2:
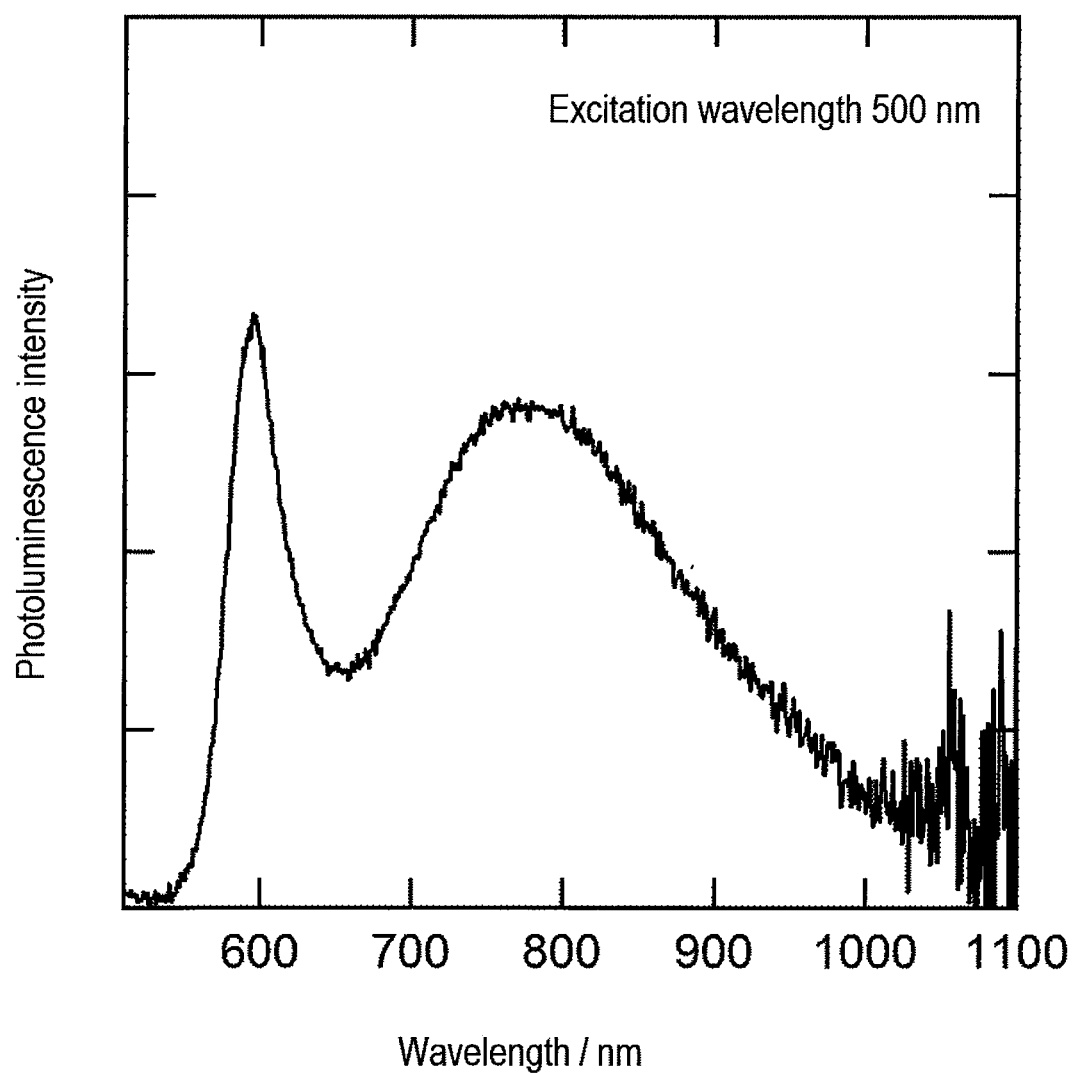
FIG. 2 shows a photoluminescence spectrum of core-shell semiconductor nanoparticles produced in Example 1.
Figure 3:
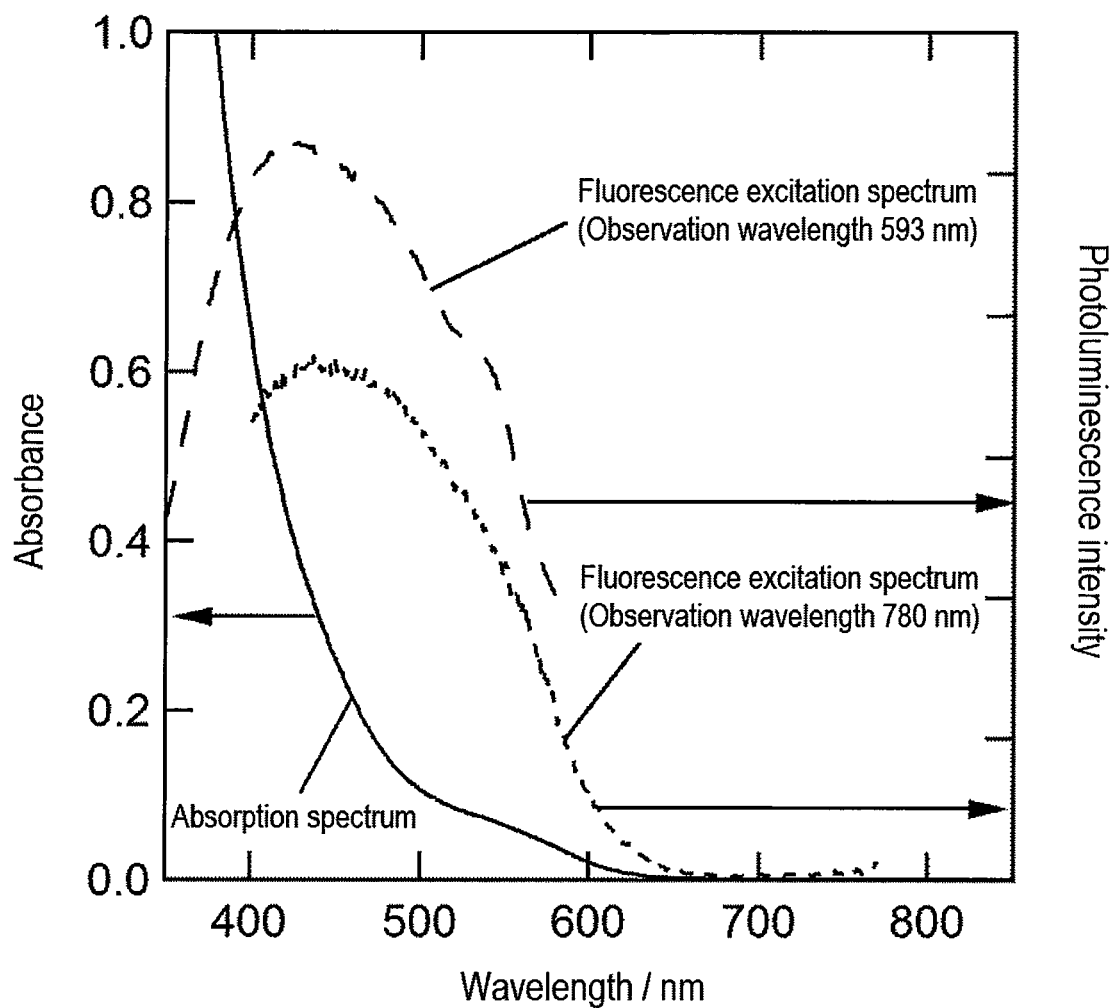
FIG. 3 shows optical absorption and excitation spectra of the core-shell semiconductor nanoparticles produced in Example 1.
Figure 4:
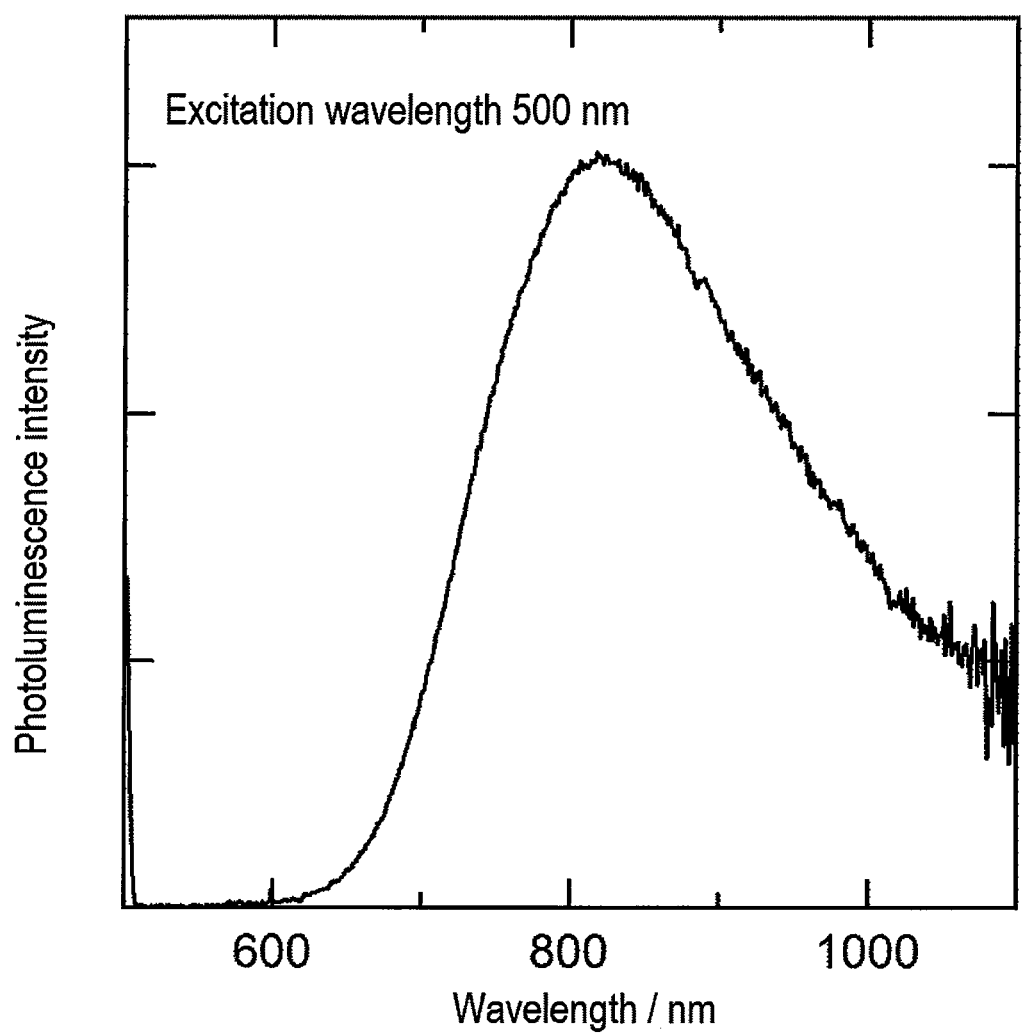
FIG. 4 shows an emission spectrum of the primary semiconductor nanoparticles (cores) produced in Example 1.
Figure 5:
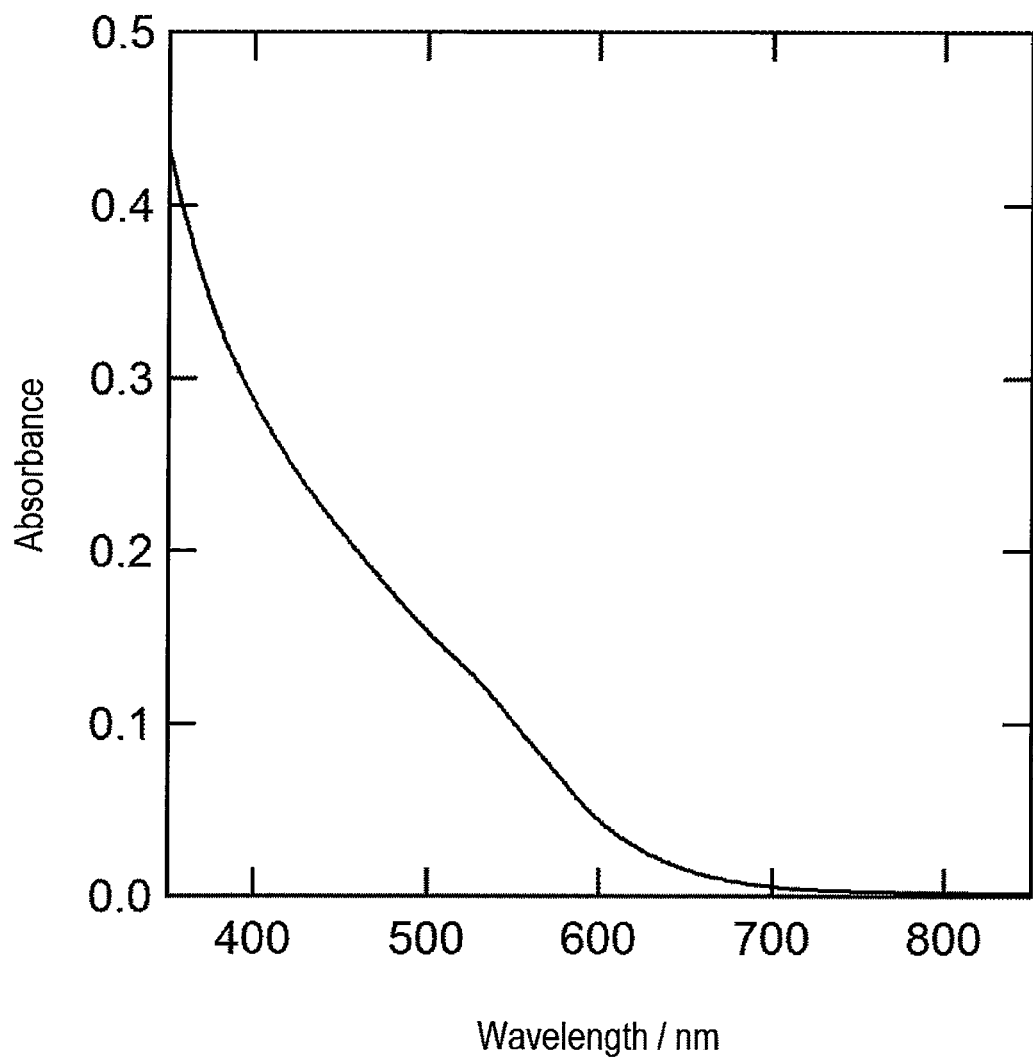
FIG. 5 shows an optical absorption spectrum of the primary semiconductor nanoparticles (cores) produced in Example 1.

The photoluminescence, absorption, and excitation spectra were measured. The results are shown in FIGS. 2 and 3. The photoluminescence spectrum was measured at an excitation wavelength of 500 nm using a multi-channel spectrometer (manufactured by HAMAMATSU PHOTONICS K.K., trade name: PMA12). The absorption spectrum was measured at wavelengths of 350 nm to 850 nm using an ultraviolet-visible-near-infrared spectrophotometer (manufactured by JASCO Corporation, trade name: V-670). The excitation spectrum was measured at observation wavelengths of 593 nm and 780 nm (i.e., corresponding to peaks observed in the photoluminescence spectrum) using a fluorescence spectrophotometer (manufactured by HORIBA, Ltd., trade name: Fluoromax-4). As shown in FIG. 2, the core-shell semiconductor nanoparticles obtained in Example 1 were observed to exhibit a sharp photoluminescence peak at a wavelength of around 593 nm with a full width at half maximum of approximately 38 nm. As shown in FIG. 3, in the excitation spectrum at the observation wavelength of 593 nm, an exciton peak was observed at a wavelength of around 540 nm. For a reference, FIGS. 4 and 5 show a photoluminescence spectrum and an absorption spectrum of the primary semiconductor nanoparticles (Ag—In—S). Ag—In—S not covered with a shell exhibited a broad photoluminescence spectrum with a peak at around 820 nm, while the absorption and excitation spectrum had no exciton peak.

In Example 1, the photoluminescence lifetime of photoluminescence observed to be the sharp peak was measured. In measurement of the photoluminescence lifetime, using a fluorescence lifetime measurement device (trade name: Quantaurus-Tau) manufactured by HAMAMATSU PHOTONICS K.K, the core-shell semiconductor nanoparticles were irradiated with light having a wavelength of 470 nm as the excitation light to measure a decay curve of the photoluminescence at around the peak wavelength of the sharp photoluminescence peak. The obtained decay curve was divided into three components by parameter fitting using a fluorescence lifetime measurement/analysis software U11487-01, manufactured by HAMAMATSU PHOTONICS K.K. As a result, $\tau_1$, $\tau_2$, and $\tau_3$, and contribution rates of respective components ($A_1$, $A_2$, and $A_3$) were determined as shown in Table 1 below.

TABLE 1

| | $\tau_1$ (ns) | $A_1$ (%) | $\tau_2$ (ns) | $A_2$ (%) | $\tau_3$ (ns) | $A_3$ (%) |
|---|---|---|---|---|---|---|
| Example 1 | 3.1 | 55.7 | 28.0 | 34.5 | 121.7 | 9.8 |
| Reference Example (Ag—In—S) | 919.0 | 1 | — | — | — | — |

As shown in Table 1, a main component ($\tau 3$, A3) had a lifetime of 121.7 ns. Meanwhile, a component ($\tau 2$, A2) having a photoluminescence lifetime of 28.0 ns was also observed at an intensity similar to that of the main component. This photoluminescence lifetime was similar to a photoluminescence lifetime (30 ns to 60 ns) of the component with the largest contribution rate in photoluminescence emitted from CdSe (nanoparticles) in which band-edge emission was confirmed.

Example 2

First, 10 nmol of the primary semiconductor nanoparticles, obtained in the same procedure as in Example 1, at amount of nanoparticles was dispersed into 12 mL of oleylamine to obtain a dispersion, which was then held at 260° C. under an Ar atmosphere. Separately from this, gallium acetylacetonate (Ga(acac)$_3$) and sulfur powder were added to oleylamine at concentrations of 0.1 mmol/mL and 0.15 mmol/mL, respectively, and then stirred at 100° C. for 10 minutes, so that the gallium acetylacetonate and sulfur powder were dissolved and a mixture was obtained. Then, 4 ml of the mixture was dropped into the above-mentioned heated dispersion at a rate of 5 mL/h (at 0.5 mmol/h based on Ga). When the addition of the mixture is finished, the heating source was turned off, allowing the solution containing the dispersion with the mixture to cool down to the room temperature. Thereafter, methanol was added to the solution, so that precipitates of the core-shell semiconductor nanoparticles is obtained. Then, solid components were collected from the solution, by centrifugal separation (with a radius of 150 mm at 2,500 rpm for 3 minutes). The solid components were dissolved into chloroform, and thereafter various properties of the obtained core-shell semiconductor nanoparticles were measured. Upon measuring an average particle size of particles covered with the shell, the average particle size of the core-shell semiconductor nanoparticles was 6.65 nm. The average particle size of the primary semiconductor nanoparticles produced in this example was 5.99 nm. An average thickness of the shell was determined to be approximately 0.33 nm on average based on a difference in the average particle size between the primary semiconductor nanoparticles and the core-shell semiconductor nanoparticles.

Although the primary semiconductor nanoparticles were produced in the similar procedure as in Example 1, the average particle size of the primary semiconductor nanoparticles in Example 2 differs from that of the primary semiconductor nanoparticles produced in Example 1. It is assumed that this is because a period of time after mixing the reagents before starting a heating process in Example 2 differs slightly from that in Example 1, which allows for varying the amount of substance of a silver-thiol complex that is expected to be formed during that time. The same goes for the examples in the below and the like.

Figure 6:
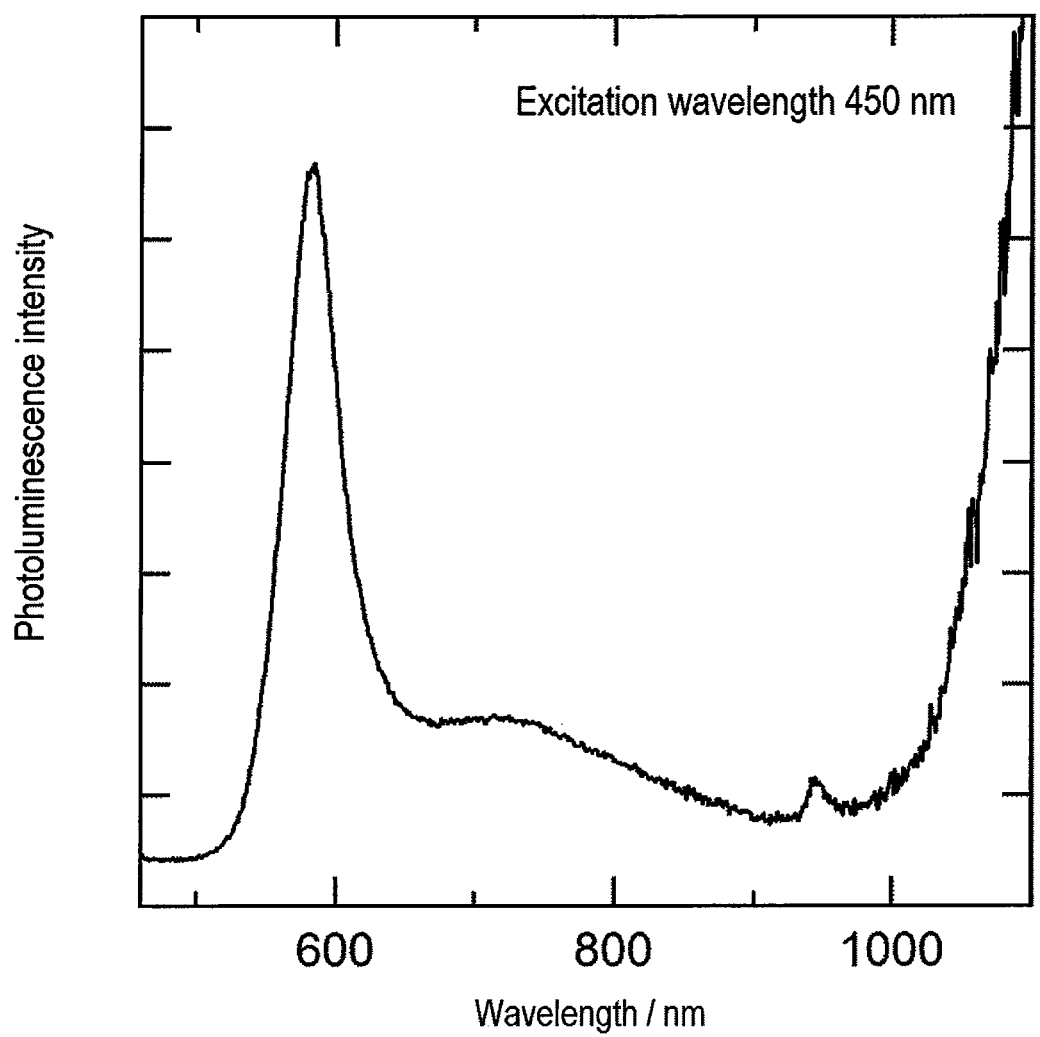
FIG. 6 shows a photoluminescence spectrum of core-shell semiconductor nanoparticles produced in Example 2.
Figure 7:
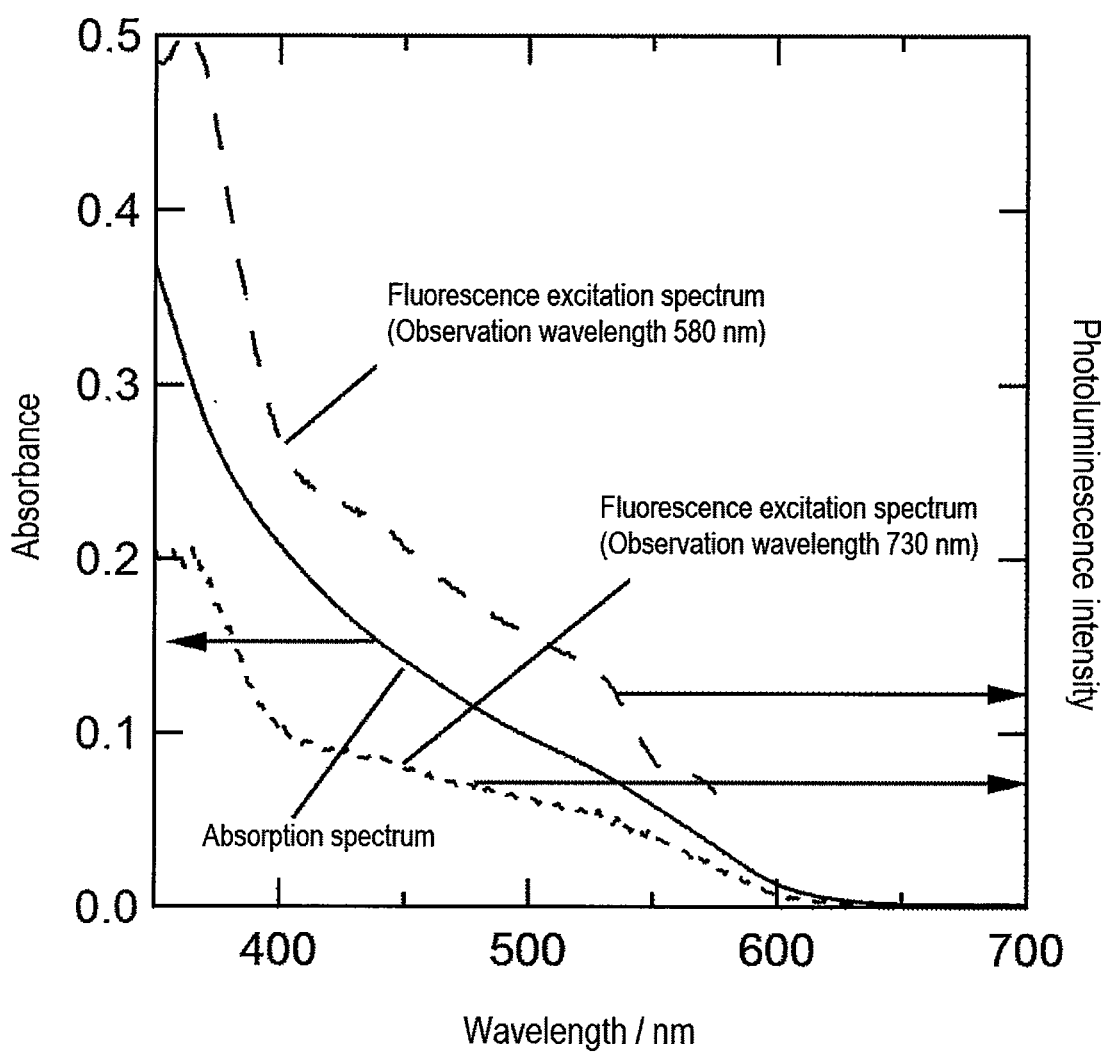
FIG. 7 shows optical absorption and excitation spectra of the core-shell semiconductor nanoparticles produced in Example 2.

The photoluminescence spectrum (at the excitation wavelength of 450 nm), the absorption spectrum, and the excitation spectra (at the observation wavelengths of 580 nm and 730 nm) were measured using the same devices as those used in Example 1. The results are shown in FIGS. 6 and 7. As shown in FIG. 6, the core-shell semiconductor nanoparticles obtained in Example 2 were observed to exhibit a sharp emission peak at a wavelength of around 584 nm with a full width at half maximum of approximately 39 nm. As shown in FIG. 7, in the excitation spectrum at the observation wavelength of 580 nm, an exciton peak was observed at a wavelength of around 530 nm. A photoluminescence quantum yield at the sharp peak (at a wavelength of 530 to 650 nm), which was assumed to be the band-edge emission, was measured using a multichannel spectrometer (at an excitation wavelength of 450 nm), which was of the same type as that used in Example 1. As a result, the luminescent quantum yield was 1.9%. Furthermore, the photoluminescence lifetime of photoluminescence observed as the sharp peak were measured in similar procedure as that in Example 1. Consequently, $\tau_1$, $\tau_2$, and $\tau_3$, and contribution rates of respective components ($A_1$, $A_2$, and $A_3$) were determined as shown in Table 2 below. As shown in Table 2, the photoluminescence lifetime of the main component ($\tau_2$, $A_2$) was 39.1 ns.

TABLE 2

|  | $\tau_1$ (ns) | $A_1$ (%) | $\tau_2$ (ns) | $A_2$ (%) | $\tau_3$ (ns) | $A_3$ (%) |
| --- | --- | --- | --- | --- | --- | --- |
| Example 2 | 5.8 | 53.1 | 39.1 | 38.4 | 173.3 | 8.5 |

Example 3

First, 30 nmol of the primary semiconductor nanoparticles, obtained in the same procedure as in Example 1, at amount of nanoparticles, 0.1 mmol of gallium acetylacetonate (Ga(acac)$_3$), 0.05 mmol of dibenzyldisulfide and 12 mL of oleylamine were charged into a flask and then heated to 260° C. at a temperature increasing rate of 10° C./min. After the solution was held at 260° C. for 20 minutes, the heating source was turned off, allowing the solution to cool. Thereafter, methanol was added to the solution, so that precipitates of the core-shell semiconductor nanoparticles is obtained. Then, solid components were collected from the solution by centrifugal separation (with a radius of 150 mm at 2,500 rpm for 3 minutes). The solid components were dissolved into chloroform, and then various properties of the obtained core-shell semiconductor nanoparticles were measured. Upon measuring an average particle size of particles each covered with the shell, the average particle size of the core-shell semiconductor nanoparticles was 8.0 nm. The average particle size of the primary semiconductor nanoparticles produced in Example 2 was 6.0 nm. Thus, an average thickness of the shell was approximately 1 nm based on a difference in the average particle size between the primary semiconductor nanoparticles and the core-shell semiconductor nanoparticles.

Figure 8:
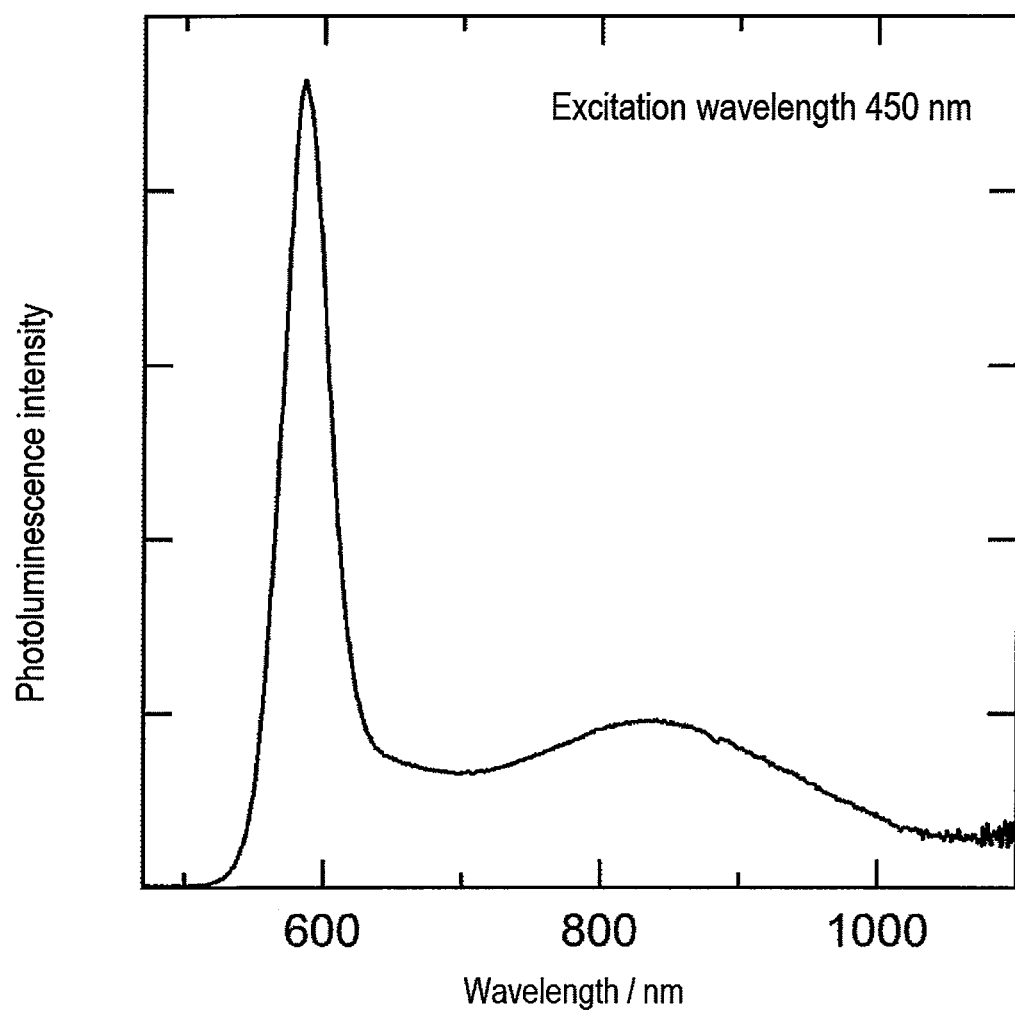
FIG. 8 shows a photoluminescence spectrum of core-shell semiconductor nanoparticles produced in Example 3.
Figure 9:
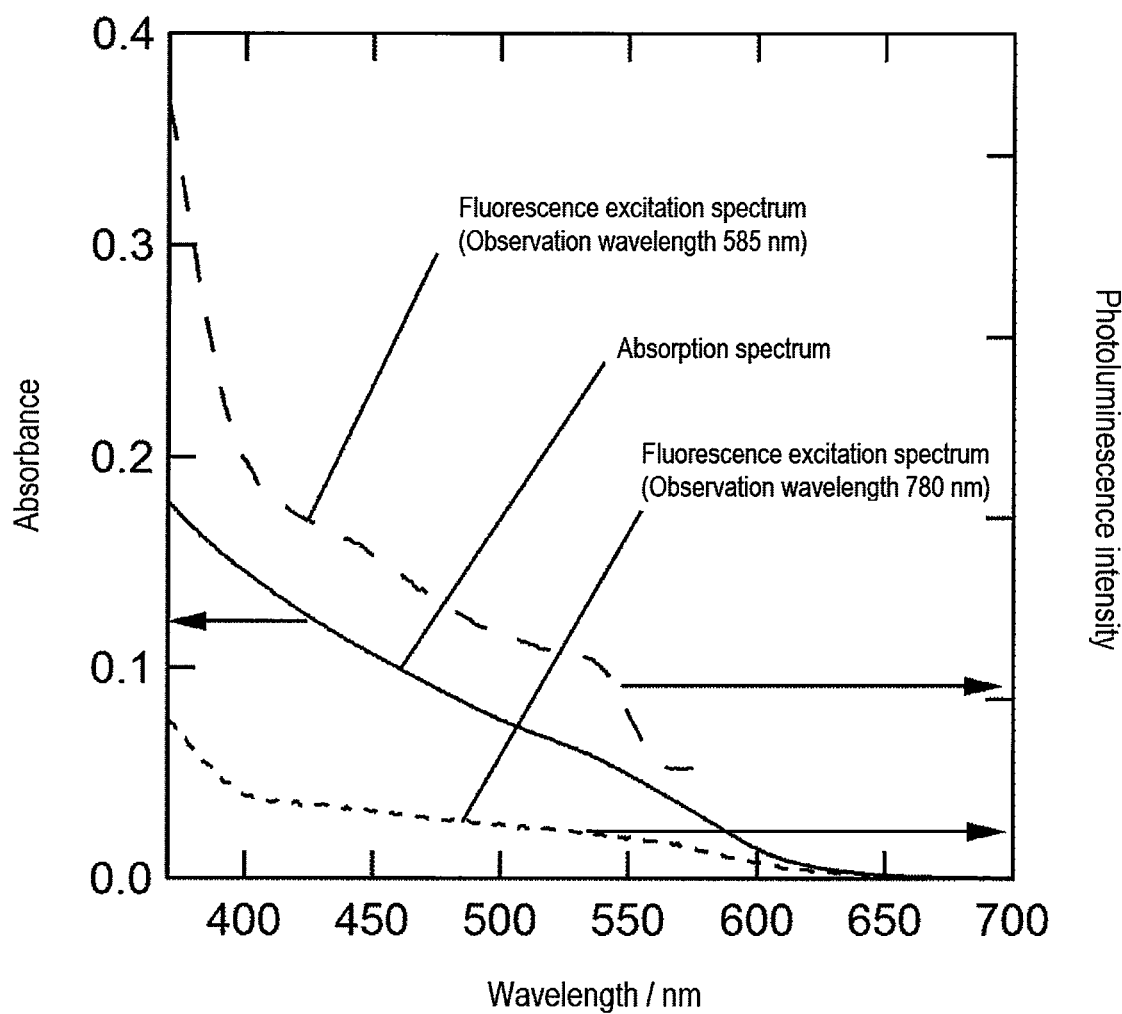
FIG. 9 shows optical absorption and excitation spectra of the core-shell semiconductor nanoparticles produced in Example 3.

The photoluminescence spectrum (at the excitation wavelength of 450 nm), the absorption spectrum, and the excitation spectra were measured using the same devices as those used in Example 1. The results are shown in FIGS. 8 and 9. As shown in FIG. 8, the core-shell semiconductor nanoparticles obtained in Example 3 were observed to exhibit a sharp photoluminescence peak at a wavelength of around 586 nm with a full width at half maximum of approximately 39 nm. As shown in FIG. 9, in the excitation spectrum at the observation wavelength of 585 nm, an exciton peak was observed at a wavelength of around 535 nm. The photoluminescence quantum yield of the core-shell semiconductor nanoparticles were measured in the same way as in Example 2.

The photoluminescence quantum yield was 14.3%. Furthermore, the photoluminescence lifetime of photoluminescence observed as the sharp peak were measured in the same procedure as that in Example 1. Consequently, $\tau_1$, $\tau_2$, and $\tau_3$, and contribution rates of respective components ($A_1$, $A_2$, and $A_3$) were determined as shown in Table 3 below. As shown in Table 3, the photoluminescence lifetime of the main component ($\tau_2$, $A_2$) was 51.4 ns.

TABLE 3

|  | $\tau_1$ (ns) | $A_1$ (%) | $\tau_2$ (ns) | $A_2$ (%) | $\tau_3$ (ns) | $A_3$ (%) |
| --- | --- | --- | --- | --- | --- | --- |
| Example 3 | 15.1 | 18 | 51.4 | 76 | 218.5 | 5 |

When comparing the photoluminescence spectra between the semiconductor nanoparticles obtained in Example 1 and Example 2, the photoluminescence intensity of the sharp peak (i.e., intensity of the band-edge emission) in Example 2 was definitely higher than the photoluminescence intensity of a broad peak (i.e., intensity of defective photoluminescence). This shows that the formation of the shell by GaS$_x$ has the advantage over the formation of the shell by InS$_x$ in obtaining the band-edge emission from the core.

When comparing the photoluminescence quantum yield of the semiconductor nanoparticles obtained in Example 2 and that in Example 3, the photoluminescence quantum yield in Example 3 was confirmed to be 7.5 times higher than that in Example 2. In the formation of the shell, the thickness of the shell in Example 3 was increased, more specifically, to be approximately 1 nm, even though Examples 2 and 3 had the same molar ratio of the Ga source for formation of the shell to the primary semiconductor nanoparticles. In view of these, it is assumed that the use of dibenzyldisulfide as a sulfur source allows the shell to continuously cover the surface of the core, which allows for effectively removing the defects on the surface of the core, so that intensity of the band-edge emission is increased.

Comparative Example 1

First, 10 nmol of the primary semiconductor nanoparticles, obtained in the same procedure as in Example 1, at amount of nanoparticles was dispersed into 12 mL of oleylamine to obtain a dispersion, which was then held at 260° C. under an Ar atmosphere. Separately from this, zinc acetate (Zn(OAc)$_2$) and sulfur powder were added to oleylamine each at a concentration of 0.1 mmol/mL, and then heated at 100° C. for 10 minutes, so that the zinc acetate and the sulfur powder were dissolved to produce a mixture. Then, 2 ml of the mixture was dropped into the above-mentioned heated dispersion at a rate of 5 mL/h (at 0.5 mmol/h in terms of Zn). When the addition of the mixture was finished, the heating source was turned off, allowing the solution containing the dispersion into which the mixture was added to cool down to the room temperature. Thereafter, methanol was added to the solution, so that producing precipitates of the core-shell semiconductor nanoparticles. Then, solid components were collected from the solution by centrifugal separation (with a radius of 150 mm at 2,500 rpm for 3 minutes). The obtained solid components were dissolved in chloroform, and then the photoluminescence spectrum (at the excitation wavelength of 450 nm) and the absorption spectrum were measured by using the same devices as those used in Example 1. The results are shown in FIGS. 10 and 11.

Figure 10:
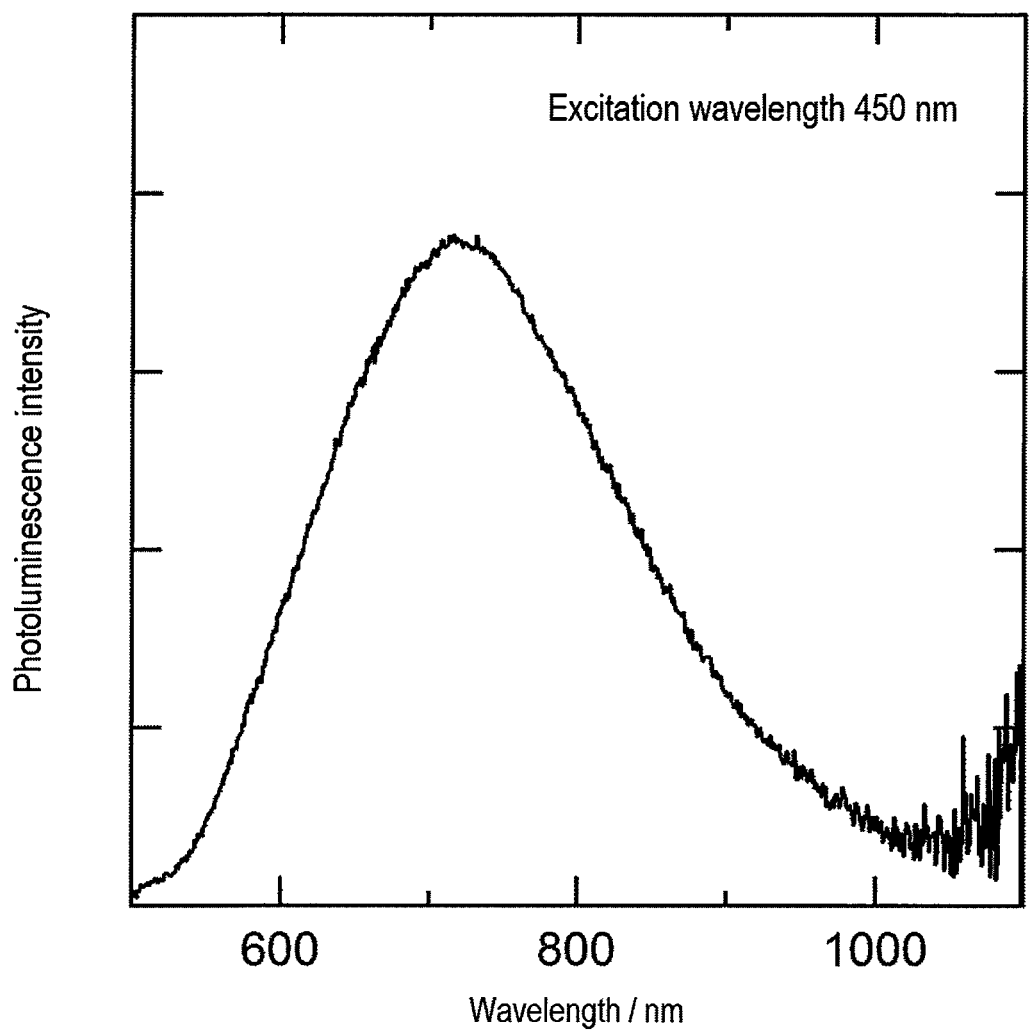
FIG. 10 shows a photoluminescence spectrum of semiconductor nanoparticles produced in Comparative Example 1.
Figure 11:
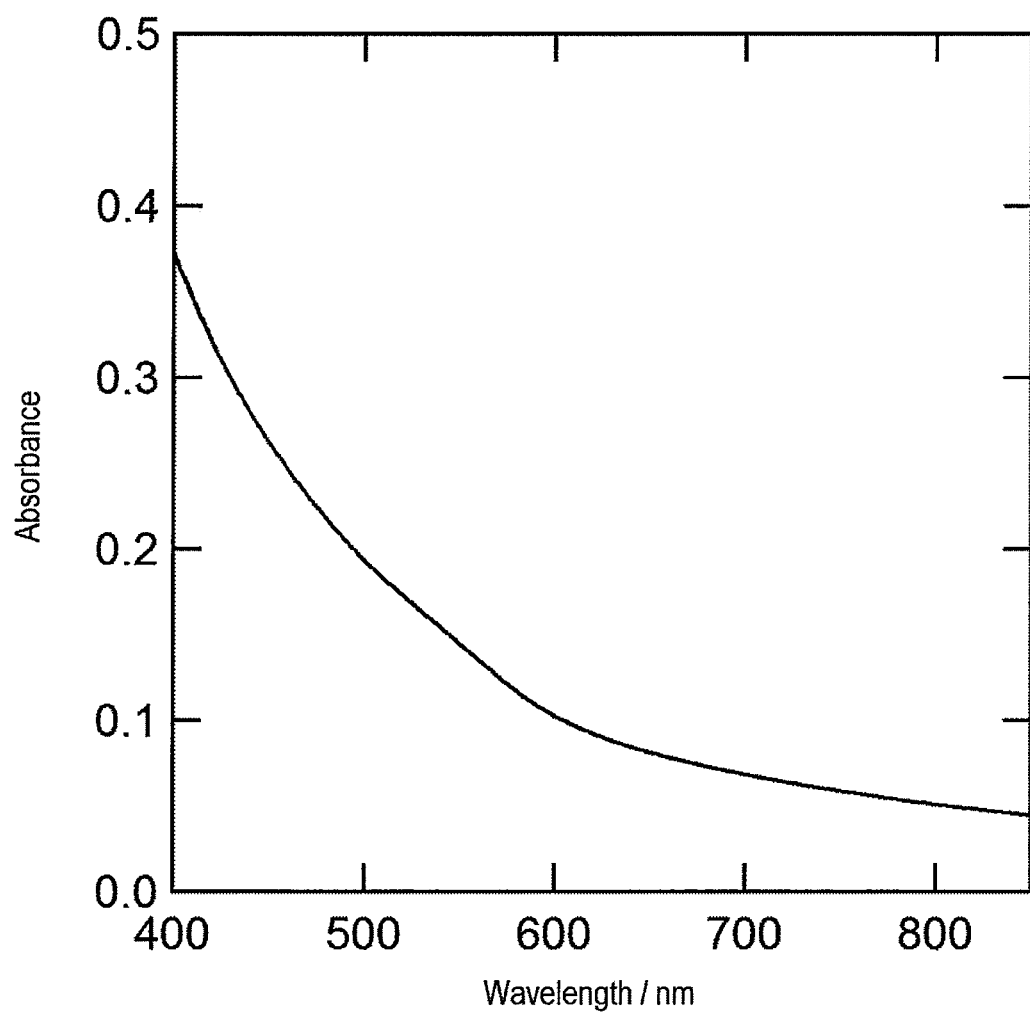
FIG. 11 shows an optical absorption spectrum of the semiconductor nanoparticles produced in Comparative Example 1.

As shown in FIG. 10, with the nanoparticles obtained in Comparative Example 1, any sharp photoluminescence peak as in Examples 1 to 3 were not observed, and a broad photoluminescence spectrum were observed. That is, no band-edge emission was observed, although ZnS has a bandgap energy larger than that of Ag—In—S and can exhibit the type-1 band alignment. It is assumed that this is because a solid solution was formed between the core and shell, so that the core-shell structure was not formed.

Examples 4A to 4D

First, 30 nmol of the primary semiconductor nanoparticles, obtained in the same procedure as in Example 1, at amount of nanoparticles, 0.1 mmol of gallium acetylacetonate (Ga(acac)$_3$), 0.05 mmol of dibenzyldisulfide and 12 mL of oleylamine were charged into a flask and then heated to 260° C. at a temperature increasing rate of 10° C./min. Immediately after the solution reaches 260° C. (Example 4A), or alternatively, after the solution was held at 260° C. for 10 minutes (Example 4B), for 20 minutes (Example 4C), and for 30 minutes (Example 4D), then the heating source was turned off to allow the solution to cool. Thereafter, each liquid containing a reaction product was subjected to centrifugal separation (with a radius of 150 mm at 2,500 rpm for 10 minutes), and a supernatant was taken out. Then, methanol was added to the supernatant solution until nanoparticles were precipitated, followed by centrifugal separation (with a radius of 150 mm at 2,500 rpm for 5 minutes), and solid components were collected. The solid components were dissolved into chloroform, and then various properties of the obtained core-shell semiconductor nanoparticles were measured.

Examples 5A to 5F

First, 30 nmol of the primary semiconductor nanoparticles, obtained in the same procedure as in Example 1, at amount of nanoparticles, 0.1 mmol of gallium acetylacetonate (Ga(acac)3), 0.15 mmol of sulfur, and 12 mL of oleylamine were charged into a flask and then heated to 260° C. at a temperature increasing rate of 10° C./min. Immediately after the solution reaches 260° C. (Example 5A), or alternatively, after the solution was held at 260° C. for 10 minutes (Example 5B), for 30 minutes (Example 5C), for 40 minutes (Example 5D), for 50 minutes (Example 5E), or for 60 minutes (Example 5F), the heating source was turned off to allow the solution to cool. Thereafter, each liquid containing a reaction product was subjected to centrifugal separation (with a radius of 150 mm at 2,500 rpm for 10 minutes), and a supernatant was taken out. Then, methanol was added to the supernatant until nanoparticles were precipitated, followed by centrifugal separation (with a radius of 150 mm at 2,500 rpm for 5 minutes), and solid components were collected. The solid components were dissolved into chloroform, and then various properties of the obtained core-shell semiconductor nanoparticles were measured.

Figure 12:
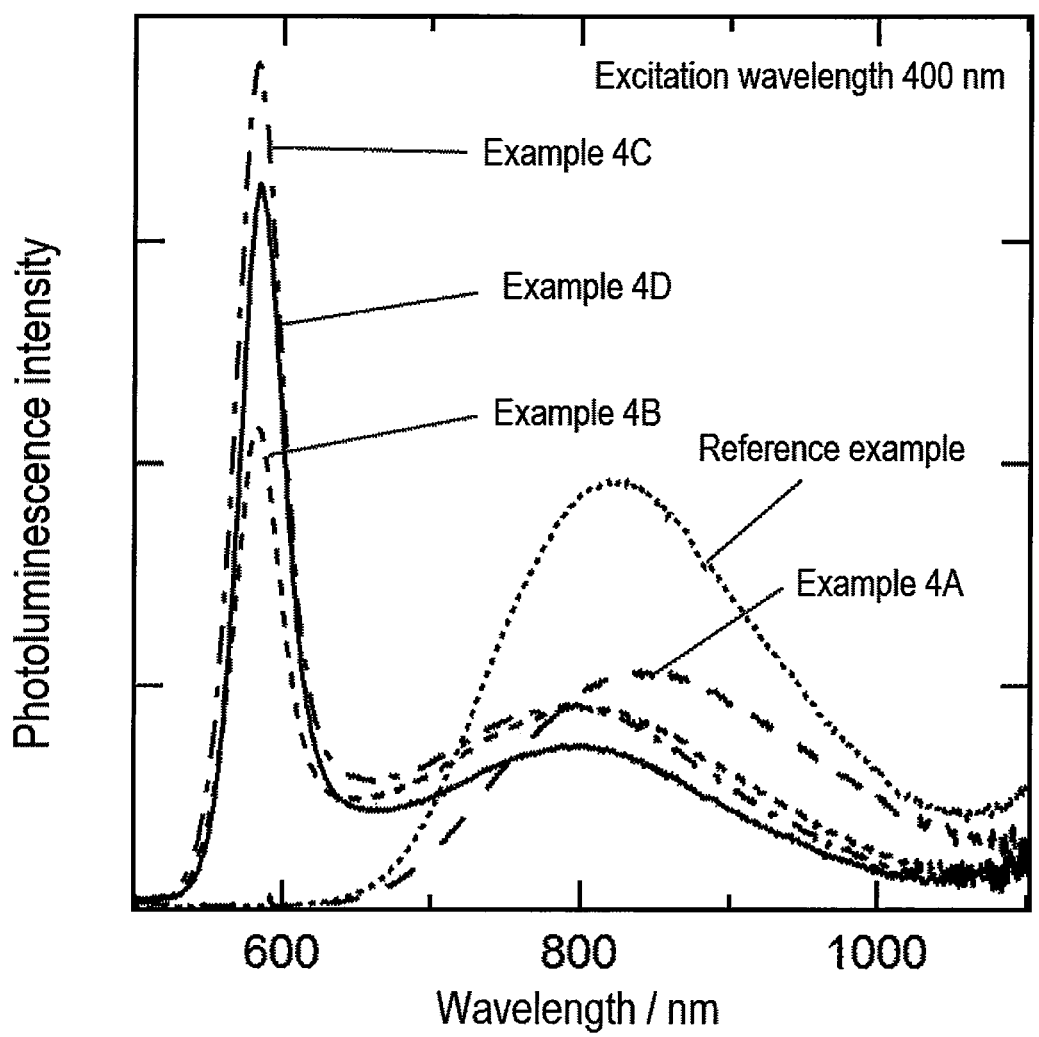
FIG. 12 shows photoluminescence spectra of semiconductor nanoparticles produced in Examples 4A to 4D.

The photoluminescence spectra (at the excitation wavelength of 400 nm) of the semiconductor nanoparticles obtained in Examples 4A to 4D and 5A to 5F were measured using the same device as that used in Example 1. The photoluminescence spectra are shown in FIG. 12 (Examples 4A to 4D) and in FIG. 13 (Examples 5A to 5F). In each diagram, the photoluminescence spectrum of the primary semiconductor nanoparticles (i.e., core) not having a shell is also shown as a reference example.

As shown in FIG. 12, among Examples 4A to 4C in which dibenzyldisulfide was used as the sulfur source to form the shell, Example 4C (with a temperature holding time of minutes) had the highest peak intensity of the band-edge emission. Example 4D (with a temperature holding time of 30 minutes) exhibited a peak intensity of the band-edge emission lower than that in Example 4C. This shows that forming the shell using dibenzyldisulfide with a relatively short temperature holding time allows for increasing band-edge emission intensity. This can also be confirmed by FIG. 14, which shows the relationship between the peak intensity of the band-edge emission and the temperature holding time in each of Examples 4A to 4C.

Figure 13:
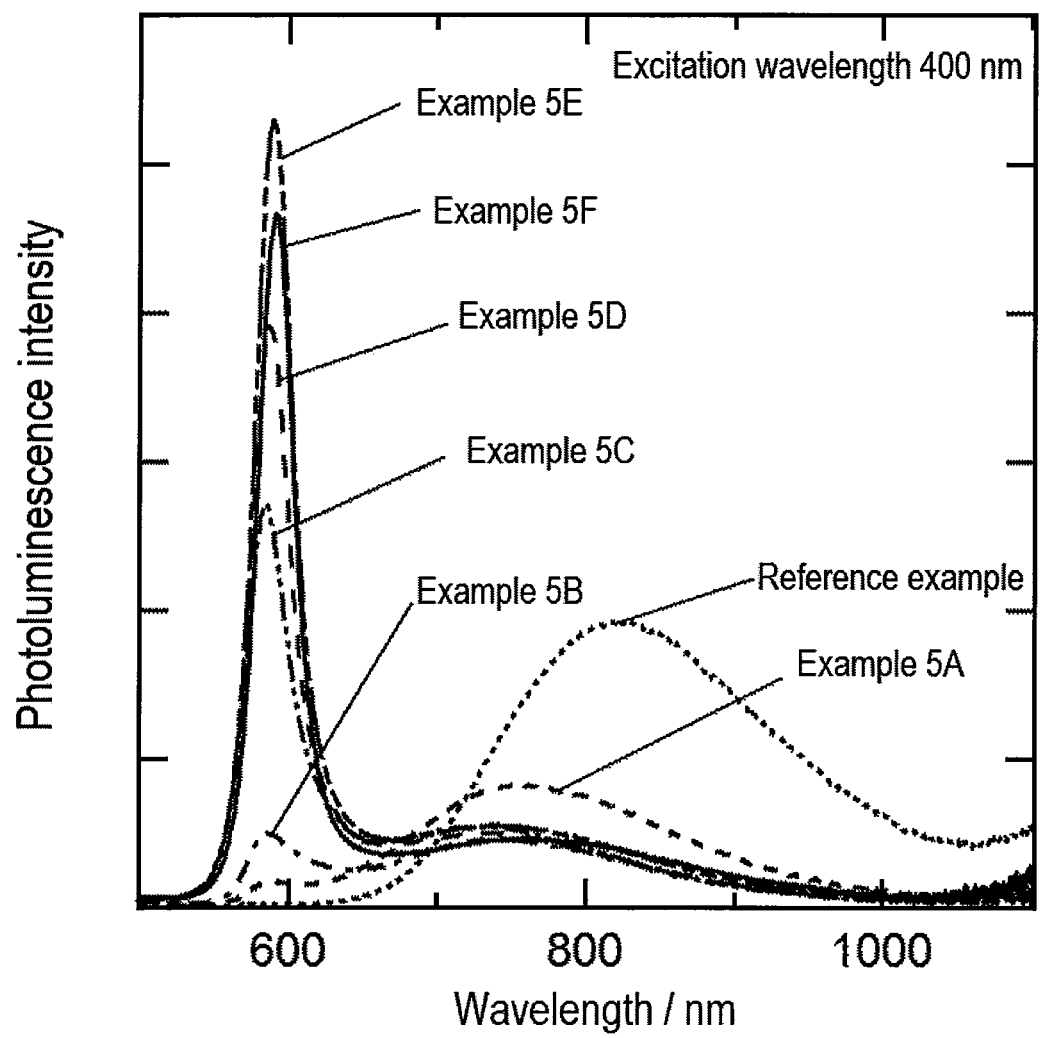
FIG. 13 shows photoluminescence spectra of semiconductor nanoparticles produced in Examples 5A to 5F.
Figure 14:
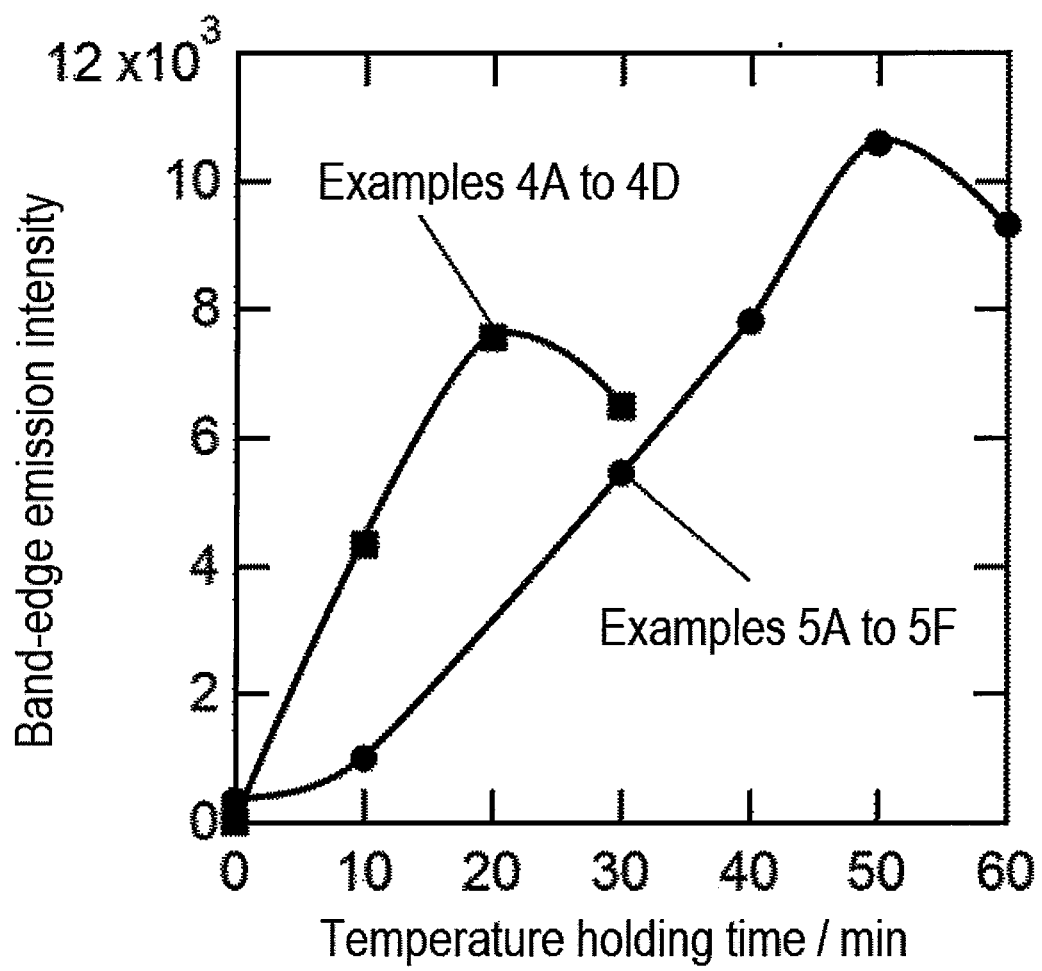
FIG. 14 shows a graph showing the relationship between the temperature holding time and the peak intensity of the band-edge emission of the semiconductor nanoparticles produced in Examples 4A to 4D and the semiconductor nanoparticles produced in Examples to 5F.

As shown in FIG. 13, among Examples 5A to 5F in which an elemental sulfur was used as the sulfur source to form the shell, Example 5E (with a temperature holding time of minutes) had the highest peak intensity of the band-edge emission. This shows that, in the case of forming the shell using the elemental sulfur as the sulfur source, a longer temperature holding time is required to obtain the core-shell particles that exhibit the higher peak intensity of the band-edge emission. This can also be confirmed by FIG. 14, which shows the relationship between the peak intensities of the band-edge emission and the temperature holding times in Examples 5A to 5F. As illustrated in FIG. 14, forming the shell using elemental sulfur with a longer temperature holding time allows for achieving the peak intensity of the band-edge emission that is higher than that of the maximum peak intensity of the band-edge emission achieved in the case of using dibenzyldisulfide.

Furthermore, as shown in FIG. 13, forming the shell using the elemental sulfur with a longer temperature holding time allows the intensity of the band-edge emission (i.e., the ratio of the band-edge emission intensity/defective photoluminescence intensity) to be increased (in particular, Examples 5E and 5F).

Figure 15:
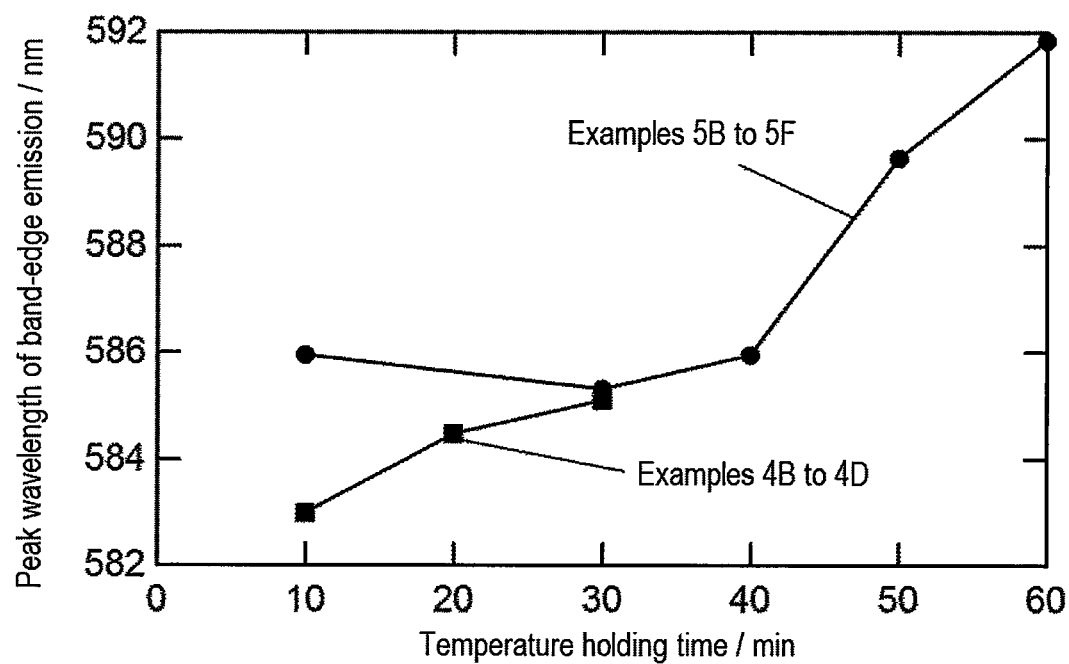
FIG. 15 shows a graph showing the relationship between the temperature holding time and the peak wavelength of the band-edge emission of the semiconductor nanoparticles produced in Examples 4B to 4D and the semiconductor nanoparticles produced in Examples to 5F.

FIG. 15 is a graph showing the relationship between the peak intensities of the band-edge emission and temperature holding times in Examples 4B to 4D and Examples 5B to 5F. It is found that, in each case of using dibenzyldisulfide or elemental sulfur, the peak wavelength is shifted toward the longer wavelength side as the temperature holding time is increased.

Observation with HRTEM and HAADF

Figure 16:
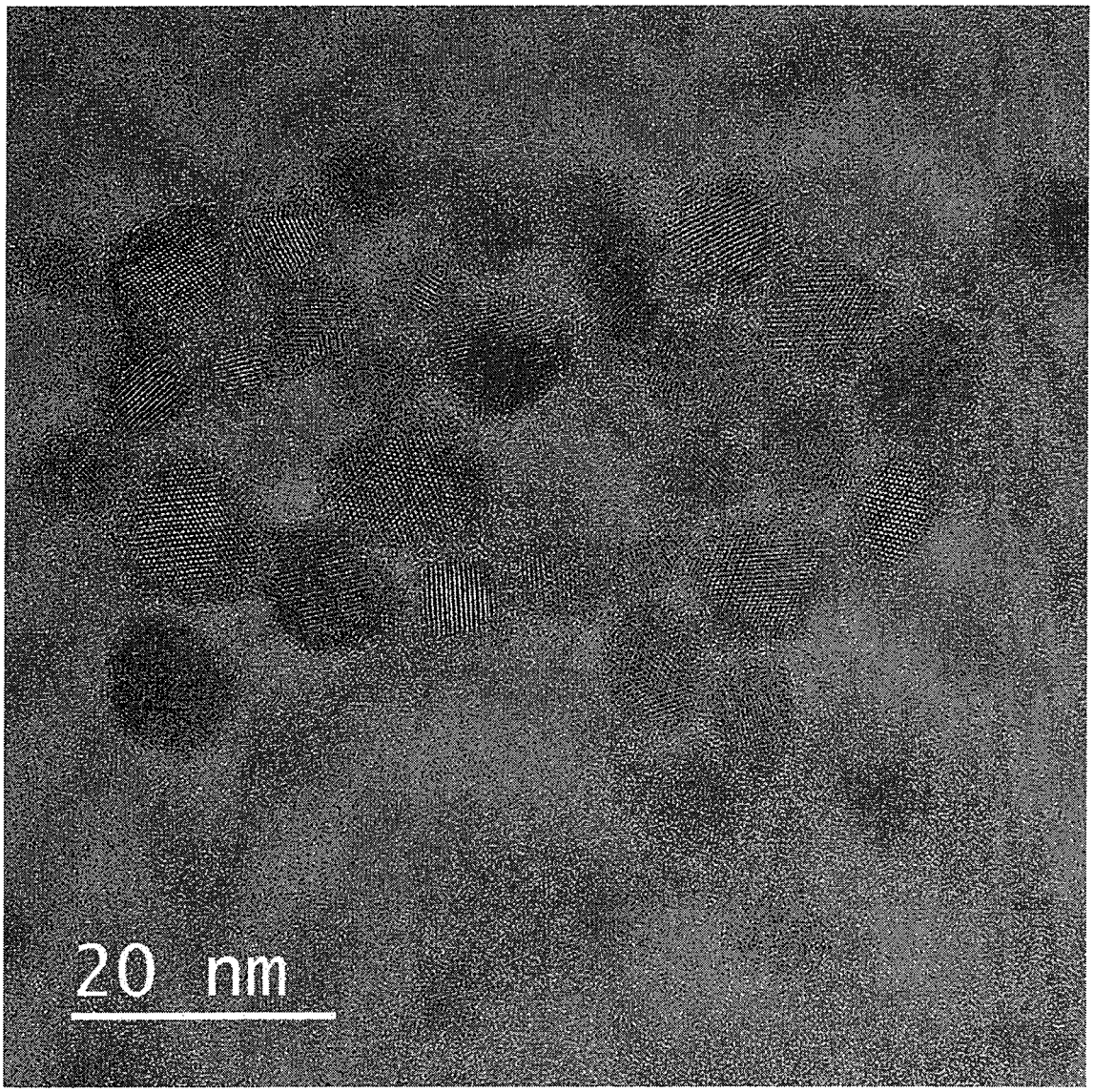
FIG. 16 shows a high-resolution transmission electron microscope (HRTEM) image of the semiconductor nanoparticles produced in Example 5F.
Figure 17:
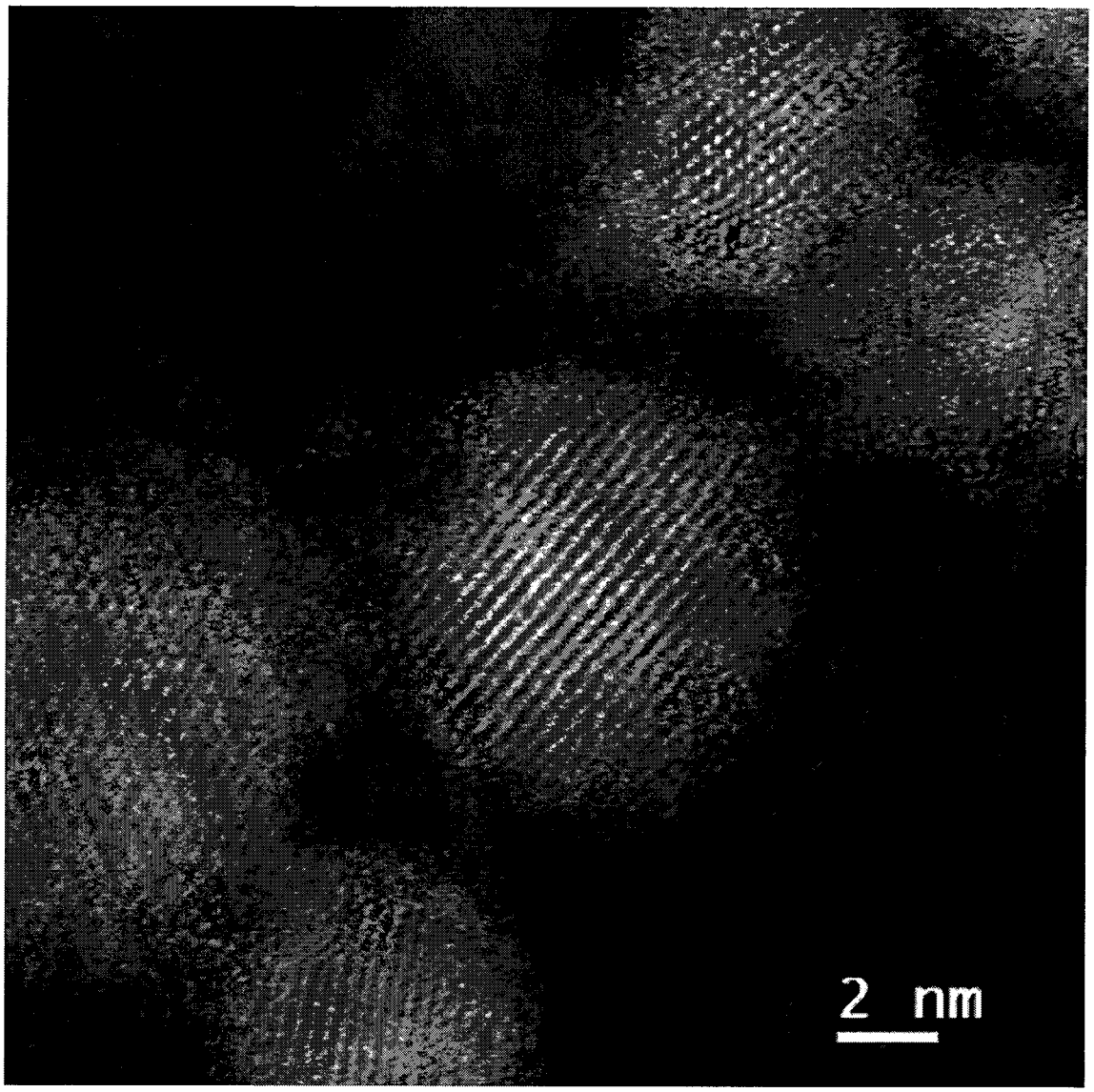
FIG. 17 shows a high-angle annular dark field (HAADF) image of the semiconductor nanoparticles produced in Example 5F.

The core-shell semiconductor nanoparticles in Example 5F were observed with HRTEM and HAADF (manufactured by JEOL Ltd., trade name: ARM-200F). FIG. 16 shows an HRTEM image, and FIG. 17 shows an HAADF image. In each image, a crystal core with a regular pattern and a shell surrounding the core and having no regular pattern were observed, and the shell was observed to be amorphous in the semiconductor nanoparticles of Example 5F.

Analysis with XPS

The core-shell semiconductor nanoparticles in Example 5F were analyzed by an X-ray photoelectron spectroscopy system (manufactured by SHIMADZU Corporation, trade name KRATOS AXIS-165X). When the peak positions derived from 3d orbital of silver and indium were compared with database, it was confirmed to be identical to the positions of their sulfides. When the peak position derived from 2p orbital of sulfur was compared with database, it was confirmed to be identical to the position of a metal sulfide. Regarding gallium, no database on its sulfide was available, so that whether gallium was present in the form of sulfide was not able to be confirmed. However, the peak position derived from 3d orbital of gallium obviously differed from that of the metal gallium, and was positioned between the peak of gallium oxide and the peak of gallium selenide. Thus, gallium is highly likely to be present in the form of sulfide.

Analysis with Energy Dispersive X-Ray Analyzer

An atomic percentage of each element contained in the core-shell semiconductor nanoparticles in Example 5F was analyzed with an energy dispersive X-ray analyzer (manufactured by EDAX Inc., trade name: OCTANE). The result is shown in Table 4.

Assuming that the composition of the core-shell semiconductor nanoparticles is $AgInS_2 \cdot Ga_2S_3$, an atomic percentage of sulfur was calculated from the result of Ag and Ga shown in Table 4 and determined to be 53.9 (17.2×2+13.1÷2× 3=53.9), which shows good agreement with the value of S shown in Table 4.

TABLE 4

|  | Ag | In | Ga | S |
| --- | --- | --- | --- | --- |
| Example 5F | 17.2% | 17.0% | 13.1% | 52.7% |

Example 6

(1) Production of Primary Semiconductor Nanoparticles (Ag—In—S)

First, 0.4 mmol of each of silver acetate (AgOAc) and indium acetate (In(OAc)3), mmol of thiourea, 35.8 mmol of n-tetradecylamine, and 0.2 mL of 1-dodecanethiol were introduced into a two-necked flask and subjected to vacuum deaeration (for 3 minutes at normal temperature), followed by heating under an Ar atmosphere at a temperature increasing rate of 5° C./min up to 150° C. The obtained suspension was allowed to cool, followed by addition of a small amount of hexane thereto at a temperature just below 90° C. Then, the suspension was subjected to centrifugal separation (with a radius of 150 mm at 4,000 rpm for minutes), and a supernatant dark red solution was taken out. Then, methanol was added to the solution until nanoparticles were precipitated, followed by centrifugal separation (with a radius of 150 mm at 2,500 rpm for 3 minutes). Then, the precipitates were dried at the normal temperature under vacuum, so that semiconductor nanoparticles (primary semiconductor nanoparticles) were obtained.

(2) Covering with Shell

First, 30 nmol of the primary semiconductor nanoparticles as the core, which were obtained in the step (1), at amount of nanoparticles, 0.1 mmol of gallium acetylacetonate (Ga (acac)$_3$), 0.15 mmol of sulfur, and 36.48 mmol of n-tetradecylamine were charged into a flask and then heated to 260° C. at a temperature increasing rate of 10° C./min. After the solution was held at 260° C. for 50 minutes, the heating source was turned off to allow the solution to cool. Thereafter, methanol was added to the solution, thereby producing precipitates of the core-shell semiconductor nanoparticles. Then, solid components were collected from the solution by centrifugal separation (with a radius of 150 mm at 2,500 rpm for 3 minutes). The solid components were dissolved into chloroform, and then various properties of the obtained core-shell semiconductor nanoparticles were measured. Upon measuring an average particle size of particles covered with the shell, the average particle size of the core-shell semiconductor nanoparticles was 8.6 nm. The average particle size of the primary semiconductor nanoparticles produced in this example was 7.1 nm. An average thickness of the shell was determined to be approximately 0.75 nm based on a difference in the average particle size between the primary semiconductor nanoparticles and the core-shell semiconductor nanoparticles.

Figure 18:
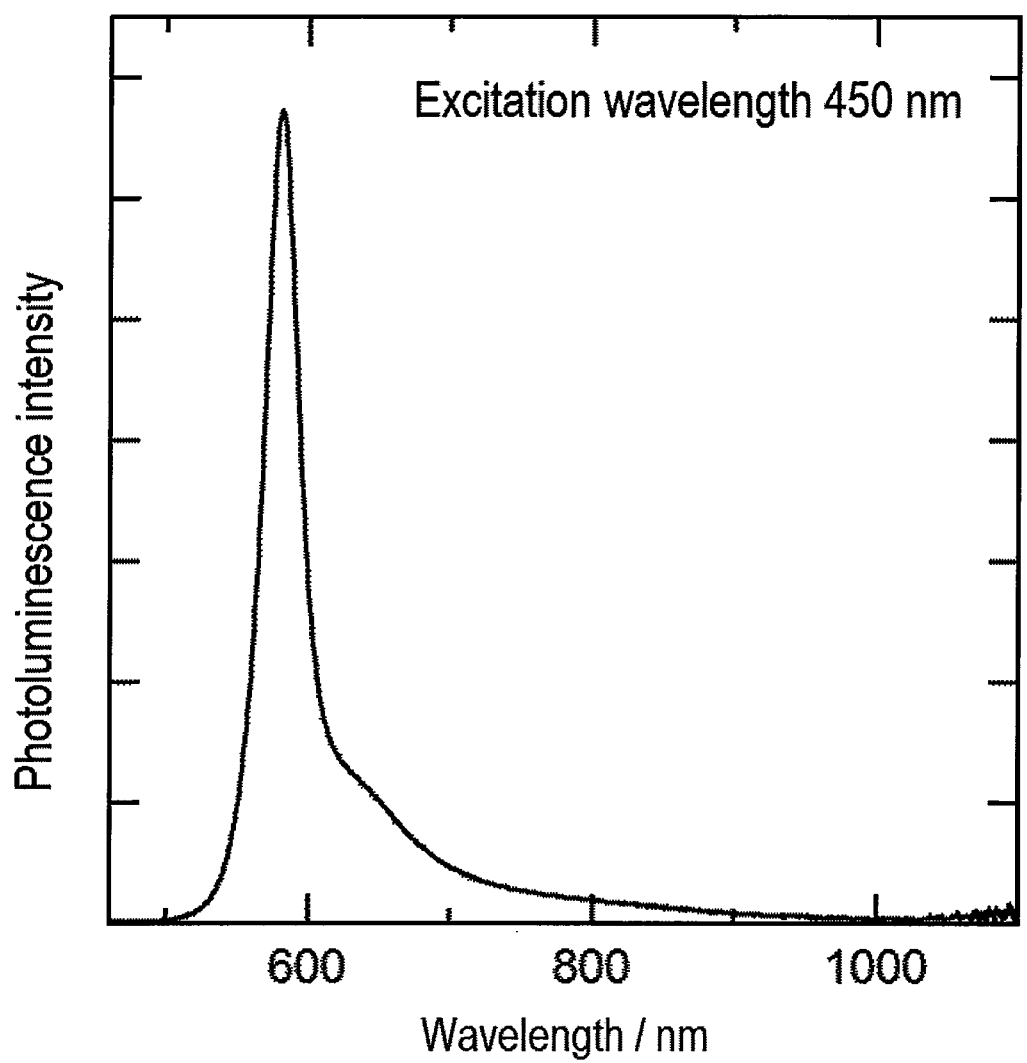
FIG. 18 shows a photoluminescence spectrum of core-shell semiconductor nanoparticles produced in Example 6.
Figure 19:
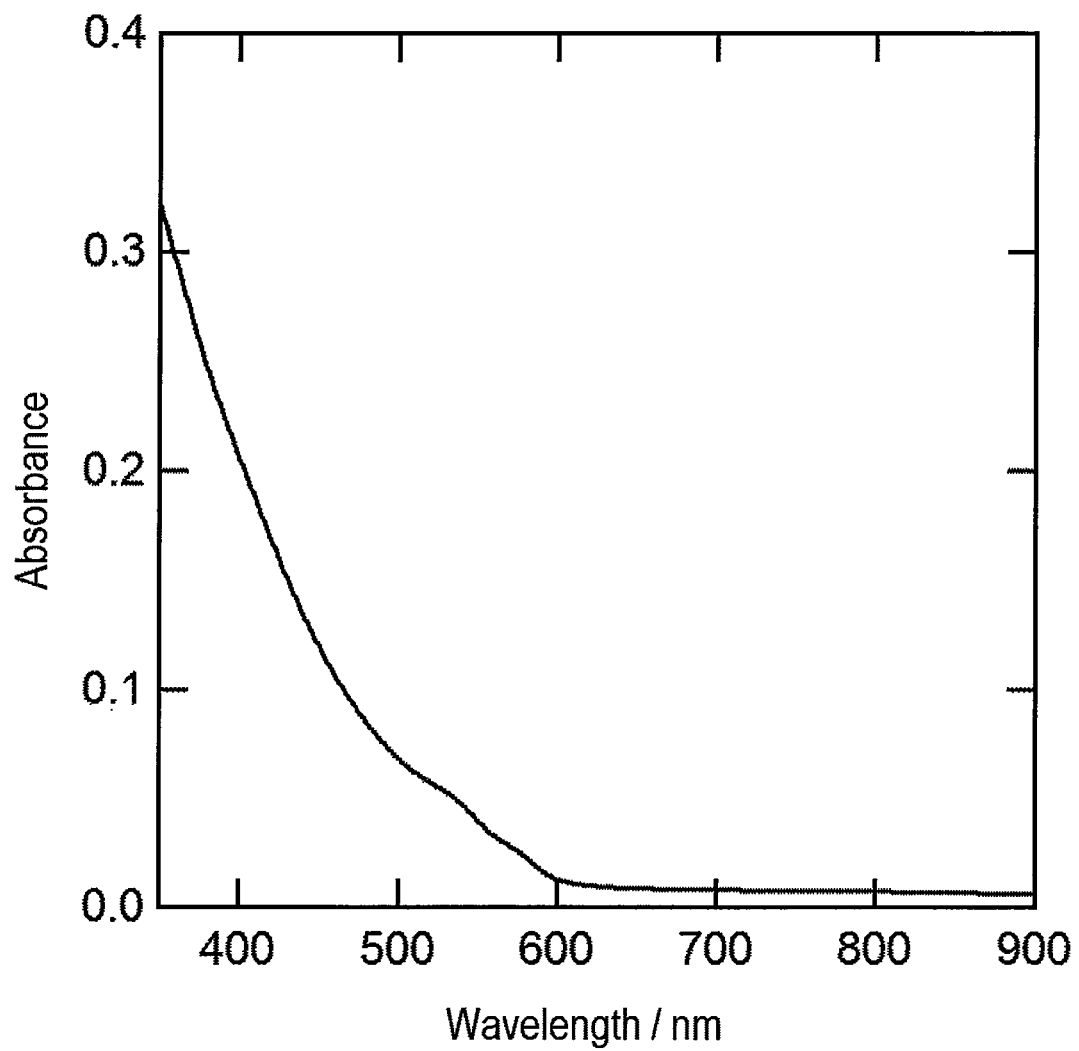
FIG. 19 shows an absorption spectrum of the core-shell semiconductor nanoparticles produced in Example 6.

The photoluminescence spectrum (at the excitation wavelength of 450 nm) and the absorption spectrum were measured using the same devices as those used in Example 1. The results are shown in FIGS. 18 and 19. As shown in FIG. 18, the core-shell semiconductor nanoparticles obtained in Example 6 were observed to exhibit a sharp photoluminescence peak at a wavelength of around 581 nm with a full width at half maximum of approximately 28 nm. As shown in FIG. 19, in the excitation spectrum at the observation wavelength of 585 nm, an exciton peak was observed at a wavelength of around 535 nm. A photoluminescence quantum yield at the sharp peak (at a wavelength of 530 to 650 nm), which was assumed to be the band-edge emission, was measured by using a multichannel spectrometer (at an excitation wavelength of 450 nm), which was of the same type as that used in Example 1. As a result, the photoluminescence quantum yield was 21.1%.

The embodiments of the present disclosure provide the semiconductor nanoparticles that enable the band-edge emission and can be used as a wavelength conversion material of a light-emitting device or as a biomolecule marker.

Although the present disclosure has been described with reference to several exemplary embodiments, it shall be understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular examples, means, and embodiments, the disclosure may be not intended to be limited to the particulars disclosed; rather the disclosure extends to all functionally equivalent structures, methods, and uses such as are within the scope of the appended claims.

One or more examples or embodiments of the disclosure may be referred to herein, individually and/or collectively, by the term "disclosure" merely for convenience and without intending to voluntarily limit the scope of this application to any particular disclosure or inventive concept. Moreover, although specific examples and embodiments have been illustrated and described herein, it should be appreciated that any subsequent arrangement designed to achieve the same or similar purpose may be substituted for the specific examples or embodiments shown. This disclosure may be intended to cover any and all subsequent adaptations or variations of various examples and embodiments. Combinations of the above examples and embodiments, and other examples and embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure may be not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter shall be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure may be determined by the broadest permissible interpretation of the following claims and their equivalents, and shall not be restricted or limited by the foregoing detailed description.

What is claimed is:

1. A method of producing semiconductor nanoparticles, comprising:
   providing a dispersion by dispersing primary semiconductor nanoparticles into a solvent, each of the primary semiconductor nanoparticles comprising a semiconductor that contains $M^1$, $M^2$, and $Z$, wherein $M^1$ is at least one element selected from the group consisting of Ag, Cu, and Au, and comprises at least Ag, $M^2$ is at least one element selected from the group consisting of Al, Ga, In, and Tl, and comprises at least In, and $Z$ is at least one element selected from the group consisting of S, Se, and Te, and comprises at least S; and
   adding, to the dispersion, a compound containing a Group 13 element, and an elemental substance of a Group 16 element or a compound containing the Group 16 element to form a semiconductor layer comprising the Group 13 element and the Group 16 element on a surface of each of the primary semiconductor nanoparticles,
   wherein the Group 13 element comprises at least Ga and the Group 16 element comprises at least S,
   wherein the semiconductor layer has an amorphous structure, and
   wherein a photoluminescence lifetime of the semiconductor nanoparticles is 200 ns or less.

2. The method of producing semiconductor nanoparticles according to claim 1, wherein the compound containing the Group 16 element is dibenzyldisulfide.

3. The method of producing semiconductor nanoparticles according to claim 1, further comprising, after the adding:
   heating the dispersion at a predetermined rate up to a peak temperature that is in a range of 200° C. to 290° C., and
   holding the dispersion at the peak temperature for a predetermined period of time.

4. The method of producing semiconductor nanoparticles according to claim 3, wherein the elemental substance of the Group 16 element is an elemental sulfur, and the predetermined period of time for holding the dispersion at the peak temperature is not less than 40 minutes and not more than 60 minutes.

5. The method of producing semiconductor nanoparticles according to claim 1, wherein the dispersion contains n-tetradecylamine.

* * * * *